(12) United States Patent
Ueda et al.

(10) Patent No.: US 9,563,403 B2
(45) Date of Patent: Feb. 7, 2017

(54) RANDOM NUMBER GENERATING DEVICE

(71) Applicant: Panasonic Intellectual Property Management Co., Ltd., Osaka (JP)

(72) Inventors: Michihito Ueda, Kyoto (JP); Yu Nishitani, Kyoto (JP); Yukihiro Kaneko, Osaka (JP); Ayumu Tsujimura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 217 days.

(21) Appl. No.: 14/568,685

(22) Filed: Dec. 12, 2014

(65) Prior Publication Data

US 2015/0100614 A1    Apr. 9, 2015

Related U.S. Application Data

(63) Continuation of application No. PCT/JP2014/002826, filed on May 28, 2014.

(30) Foreign Application Priority Data

Jun. 18, 2013  (JP) .................. 2013-127759

(51) Int. Cl.
  *G06F 7/58*   (2006.01)
  *H03K 3/84*   (2006.01)

(52) U.S. Cl.
  CPC ............... *G06F 7/582* (2013.01); *G06F 7/58* (2013.01); *G06F 7/586* (2013.01); *G06F 7/588* (2013.01); *H03K 3/84* (2013.01)

(58) Field of Classification Search
  CPC ....................................... G06F 7/588
  See application file for complete search history.

(56) References Cited

U.S. PATENT DOCUMENTS

| | | |
|---|---|---|
| 6,763,363 B1 | 7/2004 | Driscoll |
| 8,521,795 B2 | 8/2013 | Fukushima et al. |
| 2006/0020647 A1* | 1/2006 | Simon ............... G06F 7/58 708/250 |

FOREIGN PATENT DOCUMENTS

| | | |
|---|---|---|
| JP | 2004-505289 | 2/2004 |
| JP | 2008-310403 | 12/2008 |

* cited by examiner

*Primary Examiner* — Andrew Caldwell
*Assistant Examiner* — Calvin M Brien
(74) *Attorney, Agent, or Firm* — McDermott Will & Emery LLP

(57) ABSTRACT

A random number generating device of the present disclosure includes: an arithmetic random number generator that generates an arithmetic random number sequence; an arithmetic random number converter that sequentially reads at least one arithmetic random number from the arithmetic random number sequence and converts a value of the read arithmetic random number into a voltage or current value of at least two predetermined levels of gray scale having an identical polarity; a hysteresis unit that outputs values depending on a presently-input voltage or current value and a previously-input voltage or current value with respect to the sequentially-input voltage or current value; and a threshold processor that binarizes the output of the hysteresis unit.

9 Claims, 25 Drawing Sheets

SPECTRAL TEST IN 10-BIT DECIMAL NUMBER

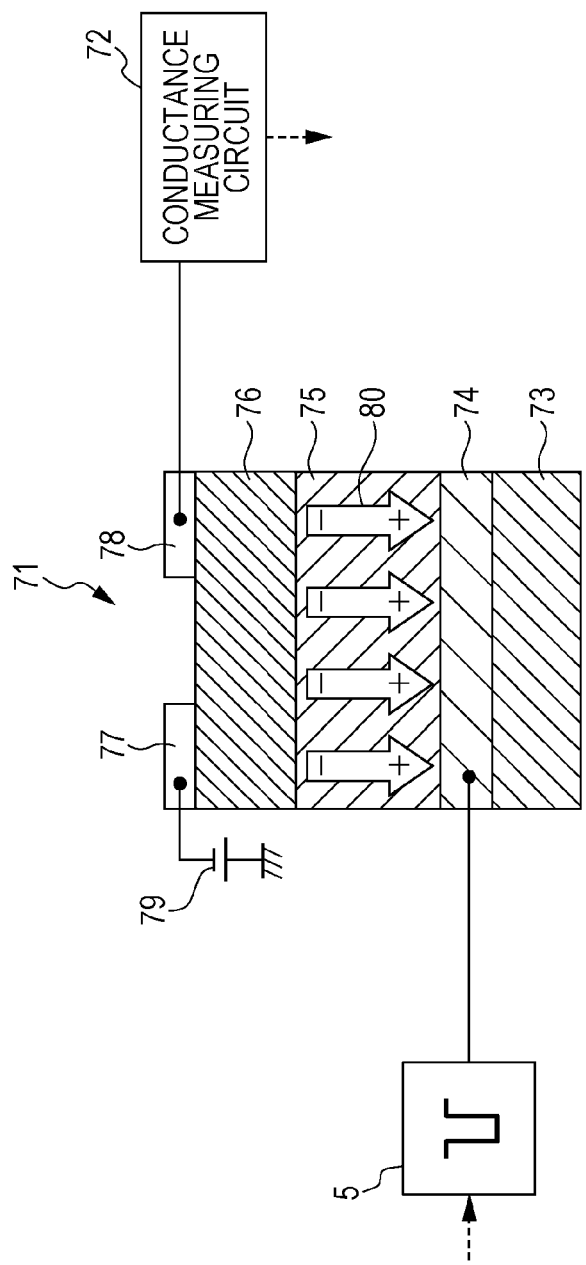

SPECTRAL TEST IN 10-BIT DECIMAL NUMBER

RANDOM NUMBER GENERATING DEVICE

This is a continuation of International Application No. PCT/JP2014/002826, with an international filing date of May 28, 2011, which claims priority of Japanese Patent Application No. 2013-127759, filed on Jun. 18, 2013, the contents of which are hereby incorporated by reference.

BACKGROUND

1. Field of the Invention

The present disclosure relates to a random number generating device used in general random number applications such as a random number key and personal authentication.

2. Description of the Related Art

Conventionally, a method in which a physical thermal noise is used and a method in which an arithmetic random number is used are well known as the random number generating device.

For example, Japanese Patent Publication No. 4,625,936B proposes a random number generating device in which the physical thermal noise is used. FIG. 26 is a view illustrating an outline configuration of the conventional random number generating device in which the thermal noise is used, and FIG. 27 is a view illustrating a method for driving the random number generating device in FIG. 26. In the conventional random number generating device of FIG. 26, a set pulse current from set current setting unit 104 and a reset pulse current, which has a reversal polarity of the set pulse current, from reset unit 103 are alternately passed through magnetoresistive element 102 to change resistance of magnetoresistive element 102, thereby generating a random number. In the random number generating device of FIG. 26, a magnetization direction of a magnetization free layer in magnetoresistive element 102 is initialized by passing the reset pulse current. FIG. 28 is a view illustrating a method for controlling the random number generating device in FIG. 26. According to Japanese Patent Publication No. 4,625,936B, in the random number generating device of FIG. 26, after the magnetization direction is substantially aligned in one direction by passing the reset pulse current through magnetoresistive element 102, a pulse current (set pulse current) having a current value in which a cumulative magnetization reversal probability becomes 0.5 is added, whereby magnetoresistive element 102 can make the random number generating device in which both an event probability of a low-resistance state (an event corresponding to "0") and an event probability of a high-resistance state (an event corresponding to "1") become 0.5. In the random number generating device of FIG. 26, the current value in which the cumulative magnetization reversal probability becomes 0.5 is decided by previously measuring a characteristic in FIG. 28. At this point, because the magnetization reversal actually obtained in magnetoresistive element 102 varies due to the thermal noise, the random number can be obtained by detecting a change in the resistance state of magnetoresistive element 102.

On the other hand, Japanese Patent Publication No. 4,828,068B proposes a random number generating device in which the arithmetic random number is used. FIG. 29 is a view illustrating an outline configuration of the conventional random number generating device in which the arithmetic random number is used. The random number generating device in FIG. 29 is called a linear feedback shift register (LFSR) that is frequently used to generate the arithmetic random number. As illustrated in FIG. 29, the linear feedback shift register can generate the arithmetic random number with a simple circuit configuration. It is clear that a generation frequency of the arithmetic random number is unbiased (the event probabilities of 0 and 1 are substantially equal to each other).

The conventional random number generating devices each have the following problems. For example, in the random number generating device of Japanese Patent Publication No. 4,625,936B in which the physical thermal noise is used, magnetoresistive element 102 has temperature dependence, or a temporal change in the characteristic is generated, which results in a problem in that the generation frequency is biased. Actually, in the random number generating device of Japanese Patent Publication No. 4,625,936B, the random number generated by the magnetization reversal of magnetoresistive element 102 is input to integrator 106 through comparator 105, and output of integrator 106 is input to error amplifier 107, thereby adjusting the magnetization reversal probability. However, it is necessary to separately provide an adjustment circuit in order to obtain the configuration, which results in a problem in that the circuit is complicated. Additionally, the magnetization reversal probability is adjusted after the random number is generated, which results in a problem in that a bias still remains in a short term.

In the random number generating device of Japanese Patent Publication No. 4,828,068B in which the arithmetic random number is used, although the bias of the generation frequency is not generated, there is a problem in that the generated arithmetic random number sequence has a periodic characteristic. Due to the periodic characteristic, possibly decipher is easily completed in the case where the arithmetic random number sequence is directly used in cipher.

SUMMARY

The present disclosure is made to solve the above problems and an object thereof is to provide a random number generating device that can generate the random number having no periodic characteristic without generating the bias of the generation frequency.

In order to solve the problems, a random number generating device according to one aspect of the present disclosure includes: an arithmetic random number generator that generates an arithmetic random number sequence; an arithmetic random number converter that sequentially reads at least one (at least one bit) arithmetic random number from the arithmetic random number sequence and converts a value of the read arithmetic random number into a voltage or current value of at least two predetermined levels of gray scale having an identical polarity; a hysteresis unit that outputs values depending on a presently-input voltage or current value and a previously-input voltage or current value with respect to the sequentially-input voltage or current value; and a threshold processor that binarizes the output of the hysteresis unit. At this point, the arithmetic random number converter alternately outputs a positive value and a negative value using the voltage or current that is converted based on the arithmetic random number, and outputs the voltage or current value of at least two levels of gray scale converted according to the value of the arithmetic random number as at least one of the positive value and the negative value.

The present disclosure is configured as described above, and has an effect that the random number having no periodic characteristic can be generated without generating the bias of the generation frequency.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIG. 5 is a view illustrating an arithmetic random number sequence generated by a linear feedback shift register in FIG. 4;

FIG. 11B is a view schematically illustrating the operation when a negative voltage pulse $V_R$ is applied to the gate electrode of the ferroelectric gate transistor in FIG. 10;

FIG. 16 is a view illustrating the arithmetic random number sequence generated by the random number generating device in FIG. 1;

FIG. 25 is a view illustrating the arithmetic random number sequence generated by the random number generating device of the comparative example;

DETAILED DESCRIPTION OF THE EMBODIMENTS

Figure 1:
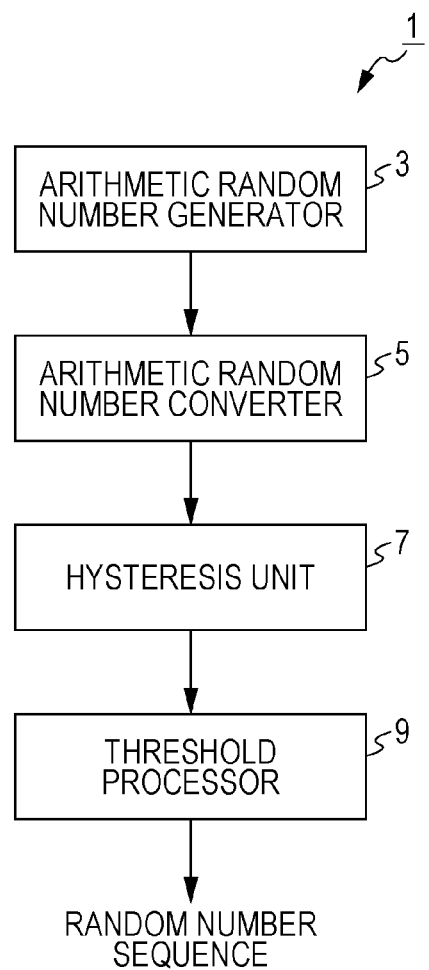
FIG. 1 is a block diagram illustrating an outline configuration of a random number generating device according to a first embodiment of the present disclosure.

Hereinafter, embodiments of the present disclosure will be described below with reference to the drawings. In the following drawings, an identical or equivalent element is designated by an identical reference numeral, and overlapping description is omitted.

Outline of the Present Disclosure

The inventors of the present disclosure have conducted research on a configuration for destroying the periodic characteristic generated in the arithmetic random number in consideration of the unbiased generation frequency of the arithmetic random number. As a result, the inventors has knowledge that the periodic characteristic can be destroyed by applying an arithmetic random number sequence to a configuration including a hysteresis characteristic while a characteristic of the arithmetic random number sequence in which the biased generation frequency is not generated is maintained. It is also found that, in the case where a positive value and a negative value are alternately input to the configuration including the hysteresis characteristic, output changes largely and the periodic characteristic of the arithmetic random number sequence is destroyed to sufficiently vary an output value. The present disclosure is made based on the above knowledge.

Specifically, a random number generating device (1, 1B, 1C) according to one aspect of the present disclosure includes: an arithmetic random number generator (3) that generates an arithmetic random number sequence; an arithmetic random number converter (5, 5B) that sequentially reads at least one (at least one bit) arithmetic random number from the arithmetic random number sequence and converts a value of the read arithmetic random number into a voltage or current value that can take at least two predetermined levels of gray scale having an identical polarity; a hysteresis unit (7, 7B, 7C) that outputs values depending on a presently-input voltage or current value and a previously-input voltage or current value with respect to the sequentially-input voltage or current value; and a threshold processor (9) that binarizes the output of the hysteresis unit. At this point, the arithmetic random number converter alternately outputs a positive value and a negative value using the voltage or current that is converted based on the arithmetic random number, and outputs the voltage or current value that can take at least two levels of gray scale converted according to the value of the arithmetic random number as at least one of the positive value and the negative value.

In the above configuration, the voltage or current value that can take the at least two predetermined levels of gray scale is input to the hysteresis unit based on the arithmetic random number. At this point, in the hysteresis unit, when the previously-input value differs from the presently-input value even if the identical value is input, different output is obtained. It can be expected that the periodic characteristic of the arithmetic random number can be eliminated by this property. In the above configuration, because the positive and negative values are alternately input to the hysteresis unit, the change in output of the hysteresis unit increases with respect to the sequentially-input value. The random number is generated again by binarizing the largely-changed output of the hysteresis unit. Accordingly, the random number having no periodic characteristic can be generated without generating the biased generation frequency.

The arithmetic random number converter may include: an N-ary number converting circuit (51) that sequentially reads an arithmetic random number having a predetermined number of bits from the arithmetic random number sequence and converts the arithmetic random number of each number of bits into an N-ary number (N≥2); and a gray-scale generating circuit (52) that converts the value of the arithmetic random number into the voltage or current by allocating the value of the arithmetic random number to one of voltage levels and current levels of at least two predetermined levels of gray scale based on the value of the arithmetic random number converted into the N-ary number. The N-ary number converting circuit reads the arithmetic random number having the predetermined number of bits from the arithmetic random number sequence, converts the read arithmetic random number into the N-ary number, and converts the N-ary number into the voltage or current value. Accordingly, an operation for the conversion into the voltage or current value and output control of the voltage or current value can easily be performed, and the arithmetic random number sequence can easily be adjusted to the voltage or current value necessary to perform an input and output operation in a minor loop of the hysteresis unit.

In a saturated loop characteristic curve of the hysteresis unit, assuming that $Y_{max}$ is a maximum output value for the input value of 0, that $Y_{min}$ is a minimum output value for the input value of 0, that $\Delta Y$ is $Y_{max}-Y_{min}$, and that $X_{W1}$, $X_{W2}$, $X_{W3}$, and $X_{W4}$ are input values in which the output value becomes $Y_L=Y_{min}+\Delta Y/10$ or $Y_H=Y_{max}-\Delta Y/10$ in ascending order, the arithmetic random number converter may output the value such that a value $N_1$ that is one of the alternately-output positive and negative values falls within a range of $X_{W1} \leq N_1 \leq X_{W2}$ while a value $N_2$ that is the other of the positive and negative values falls within a range of $X_{W3} \leq N_2 \leq X_{W4}$, or such that the value $N_2$ falls within a range of $X_{W1} \leq N_2 \leq X_{W2}$ while the value $N_1$ falls within a range of $X_{W3} \leq N_1 \leq X_{W4}$. The arithmetic random number is converted into the voltage or current value such that an inside of the saturated loop characteristic curve of the hysteresis unit, namely, the voltage or current value necessary to form the minor loop is input to the hysteresis unit. Accordingly, the output change is more irregularly obtained from the hysteresis unit, so that the random number can more randomly be obtained.

The arithmetic random number converter may output the voltage or current value that can take at least two levels of gray scale converted according to the value of the arithmetic random number as the value $N_1$ that is one of the alternately-output positive and negative values, and may output a predetermined fixed value as the value $N_2$ that is the other of the positive and negative values.

The current or voltage value is input based on the arithmetic random number as the value $N_1$ that is one of the positive and negative values alternately input to the hysteresis unit, and the predetermined fixed value is input as the value $N_2$ that is the other of the positive and negative values. Therefore, while the change in output of the hysteresis unit is increased, the number of arithmetic random numbers (the number of bits) necessary to generate the random number can be decreased to half compared with the case where the arithmetic random number is used in both the values $N_1$ and $N_2$. Accordingly, an operation amount for generating the arithmetic random number in the arithmetic random number generator and an operation amount for the conversion into the voltage or current value in the arithmetic random number converter can be decreased to half.

The arithmetic random number converter may output the voltage, and the hysteresis unit may include a ferroelectric gate transistor (71) in which the voltage output from the arithmetic random number converter is input to a gate, and conductance between a source and a drain changes according to a change in voltage input to the gate. In the ferroelectric gate transistor, polarization is generated in a ferroelectric body based on the voltage applied to the gate, and channel conductance becomes a multi-level of gray scale according to the polarization. A relationship between the voltage applied to the ferroelectric body and the polarization generated by the voltage has a hysteresis. When the ferroelectric gate transistor is used as the hysteresis unit, the output having the hysteresis can be obtained with the multi-level of gray scale based on the voltage output from the arithmetic random number converter. Accordingly, the hysteresis unit in which the output to input largely changes can easily be made with a simple configuration.

The arithmetic random number converter may output the current, and the hysteresis unit may include a magnetic body (21) such that a magnetization state of the magnetic body changes by causing the magnetic body to generate a magnetic field based on the current output from the arithmetic random number converter. The magnetic body is magnetized according to the magnetic field generated based on the current, and a relationship between the current and the magnetization has the hysteresis. When the magnetic body is used as the hysteresis unit, the output having the hysteresis can be obtained with the multi-level of gray scale based on the current output from the arithmetic random number converter. Accordingly, the hysteresis unit in which the output to input largely changes can easily be made with a simple configuration.

The arithmetic random number converter may output the voltage, and the hysteresis unit may include a resistance change element (41) in which a resistance value changes by applying the voltage output from the arithmetic random number converter. In the resistance change element, the conductance of the resistance change element changes because the resistance value changes based on the applied voltage, a relationship between the applied voltage and the resistance value has the hysteresis. When the resistance change element is used as the hysteresis unit, the output having the hysteresis can be obtained with the multi-level of gray scale based on the voltage output from the arithmetic random number converter. Accordingly, the hysteresis unit in which the output to input largely changes can easily be The arithmetic random number generator may include a linear feedback shift register (31). Therefore, the arithmetic random number can easily be generated with a simple configuration.

The threshold processor may use an average value of the previously-input values as a binarizing threshold with respect to the value sequentially output from the hysteresis unit. Therefore, the random number can reliably and easily be generated based on the output change in the hysteresis unit.

First Embodiment

A first embodiment of the present disclosure will be described below. FIG. 1 is a block diagram illustrating an outline configuration of a random number generating device according to the first embodiment of the present disclosure. As illustrated in FIG. 1, random number generating device 1 according to a first embodiment includes arithmetic random number generator 3, arithmetic random number converter 5, hysteresis unit 7, and threshold processor 9.

Arithmetic random number generator 3 generates and outputs an arithmetic random number sequence. A plurality of arithmetic random numbers sequentially output from arithmetic random number generator 3 constitute an arithmetic random number sequence. Arithmetic random number converter 5 converts a value of the arithmetic random number into a voltage or current value based on the generated arithmetic random number sequence.

Hysteresis unit 7 includes a hysteresis element. The output is sequentially input to the hysteresis element from arithmetic random number converter 5, and the output of the hysteresis element changes according to a history of the input value. Threshold processor 9 binarizes the output of hysteresis unit 7 using a predetermined threshold.

Figure 2:
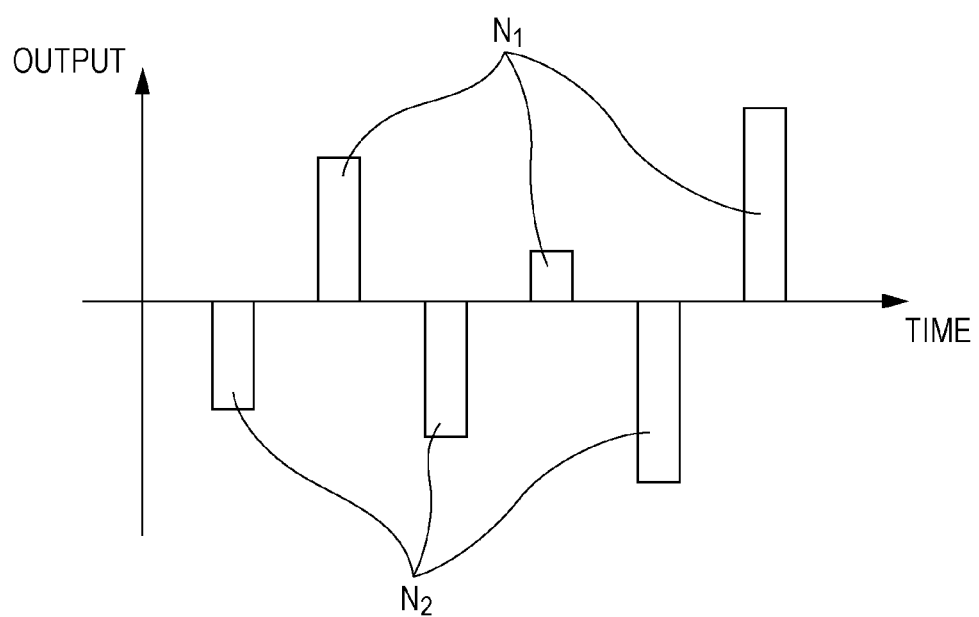
FIG. 2 is a graph illustrating a temporal change in output in an arithmetic random number converter of the random number generating device in FIG. 1.

FIG. 2 is a graph illustrating a temporal change in the output in arithmetic random number converter 5 of the random number generating device in FIG. 1. As illustrated in FIG. 2, in the first embodiment, arithmetic random number converter 5 alternately outputs a positive value and a negative value using the voltage or current that is converted based on the arithmetic random number sequence. In FIG. 2, $N_1$ is a positive numerical sequence and $N_2$ is a negative numerical sequence. Arithmetic random number converter 5 sequentially reads at least one (at least one bit) of the predetermined-arithmetic random numbers from the arithmetic random number sequence, converts a value of the read arithmetic random number into the voltage or current value that can take at least two predetermined levels of gray scale, and generates the numerical sequences $N_1$ and $N_2$ based on the converted voltage or current value.

In FIG. 2, both the numerical sequences $N_1$ and $N_2$ are converted into the voltage or current value that can take at least two predetermined levels of gray scale. However, the present disclosure is not limited to the above example, but a fixed value may be used as one of the positive and negative values.

Figure 3:
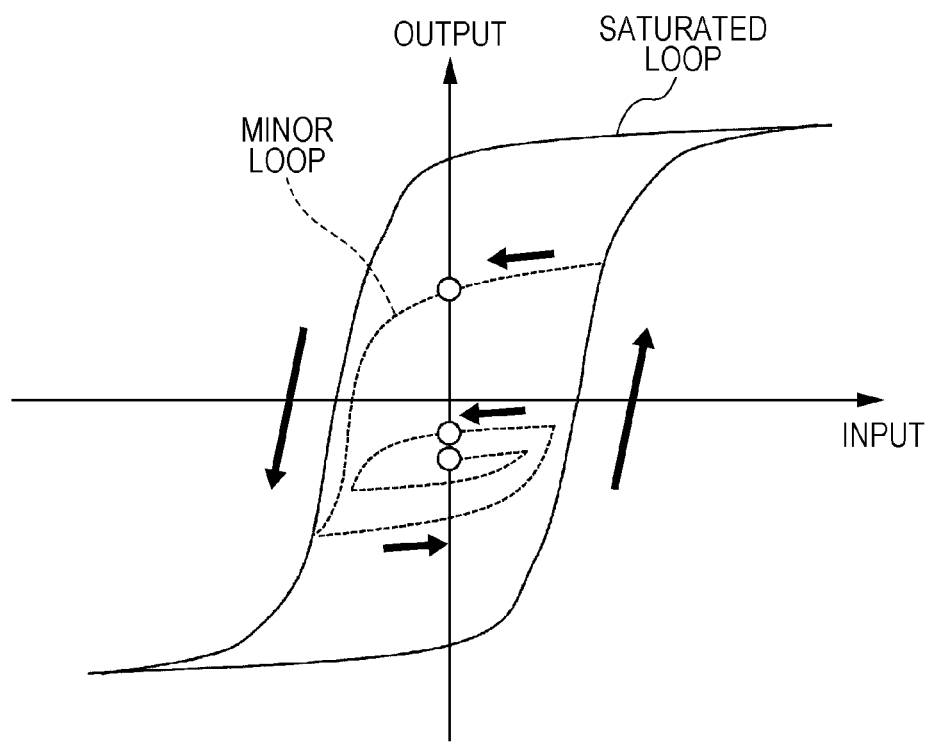
FIG. 3 is a graph illustrating an input and output characteristic of a hysteresis unit of the random number generating device in FIG. 1.

FIG. 3 is a graph illustrating an input and output characteristic of hysteresis unit 7 of the random number generating device in FIG. 1. Hysteresis unit 7 has a hysteresis characteristic in which an input value increasing direction differs from an input value decreasing direction in an output value changing passage. That is, hysteresis unit 7 outputs values depending on the presently-input voltage or current value and the previously-input voltage or current value with respect to the sequentially-input voltage or current. In FIG. 3, a mode of the input and output change is illustrated counterclockwise. However, sometimes the mode of the input and output change becomes clockwise. In the case where an absolute value of the input value is sufficiently large, the mode of the input and output change tracks on a constant curve. This is called a saturated loop. On the other hand, in the case where the absolute value of the input value is smaller than the saturated loop, the change in the output value to the input value tracks inside the saturated loop. This is called a minor loop. The minor loop is substantially innumerable.

Using the characteristic, the range of the value input to hysteresis unit 7 is set to the range where hysteresis unit 7 is operated in the minor loop, and the numerical sequences $N_1$ and $N_2$ having the reversal polarities are alternately input as illustrated in FIG. 2, which allows the output value of hysteresis unit 7 to be intricately changed according to the previously-input value (input history).

The inventors of the present disclosure completed the present invention by obtaining the knowledge that the output value of hysteresis unit 7 is binarized using a predetermined threshold to be able to generate the random number having no periodic characteristic and the unbiased generation frequency. The unbiased generation frequency of the random number generated based on the output value of hysteresis unit 7 is considered due to the comprehensive dependence of the value sequentially input to hysteresis unit 7 on the numerical sequences $N_1$ and $N_2$ based on the arithmetic random number sequence. Even if hysteresis unit 7 exerts the temperature dependence or even if the temporal change in the hysteresis characteristic is generated, because an influence of the value sequentially input to hysteresis unit 7 is dominant, the generation frequency is unbiased in the generated random number, but the generated random number has no periodic characteristic.

The effect generated by alternately inputting the numerical sequences $N_1$ and $N_2$ having the reversal polarities will be described below. In the hysteresis characteristic, the output value is hardly changed even if the values having the identical polarity are continuously input. This characteristic holds true for the case where the values having the identical polarity and the values of 0 are alternately input. When the alternately-input numerical sequences $N_1$ and $N_2$ have the identical polarity, the value does not change even if the output value of hysteresis unit 7 is binarized using the predetermined threshold. Accordingly, the continuation of the identical numerical values degrades the characteristic of the random number (see a later-described comparative example). From this viewpoint, by alternately inputting the numerical sequences $N_1$ and $N_2$ having the reversal polarities, a unique influence of the hysteresis characteristic can be eliminated to generate the high-quality random number.

As described above, in random number generating device 1 of the first embodiment, the extremely high-quality random number having the unbiased distribution and no periodic characteristic can be obtained.

Specific Configuration of Random Number Generating Device

The more specific configuration of random number generating device 1 of the first embodiment will be described below.

Figure 4:
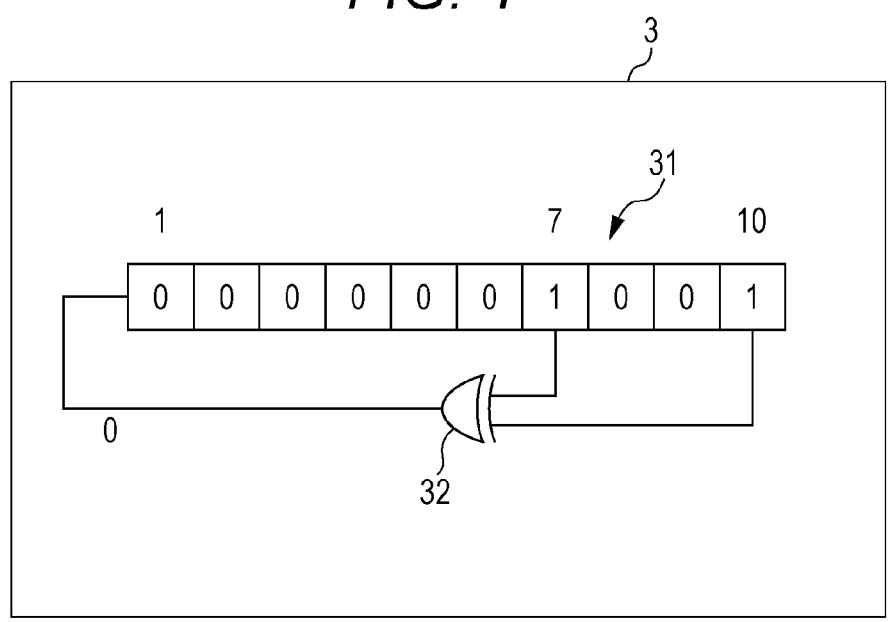
FIG. 4 is a view illustrating a configuration example of an arithmetic random number generator of the random number generating device in FIG. 1.

FIG. 4 is a view illustrating a configuration example of arithmetic random number generator 3 of the random number generating device in FIG. 1. As illustrated in FIG. 4, for example, arithmetic random number generator 3 includes Linear Feedback Shift Register (LFSR) 31. LFSR 31 having a configuration of a 10-bit length is illustrated in FIG. 4. However, LFSR 31 is not limited to the configuration in FIG. 4.

A predetermined initial value except a value in which all the bits are 0 is provided to LFSR 31. LFSR 31 is configured such that the value at a bit position (tap position) of a bit sequence corresponding to a feedback polynomial expression is input to exclusive OR unit 32 according to the bit length. The output of exclusive OR unit 32 is input to a first bit of the bit sequence. For the bit sequence having the 10-bit length, in 10 bits of an initial value, exclusive OR of seventh and tenth bits is input to the next first bit, and the values at the previous bit positions are input to the second bit and after while shifted (shifted rightward in FIG. 4). The binary arithmetic random numbers are sequentially generated by the repetition. The use of LFSR 31 can easily obtain the arithmetic random number with a small-scale circuit.

Figure 5:
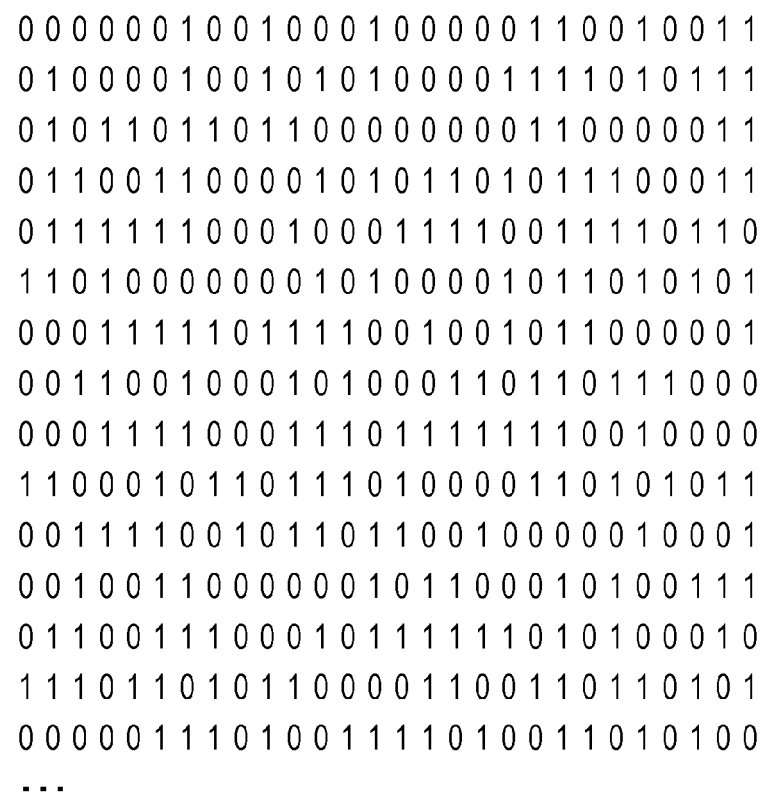
Figure 6:
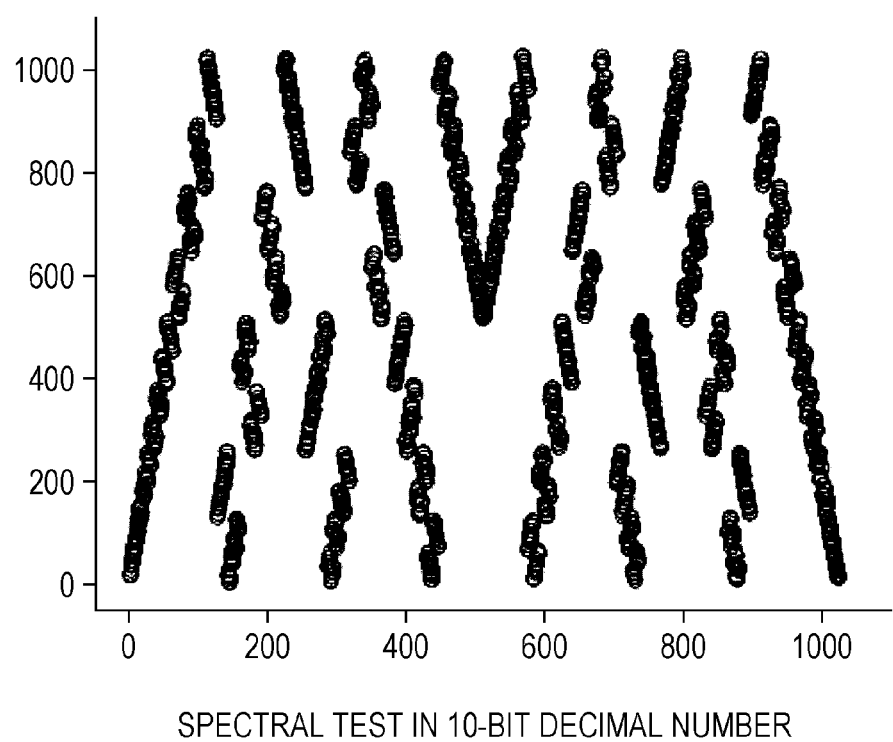
FIG. 6 is a graph illustrating a spectral test result of the arithmetic random number sequence in FIG. 5.

FIG. 5 is a view illustrating the arithmetic random number sequence generated by LFSR 31 in FIG. 4. FIG. 6 is a graph illustrating a spectral test result of the arithmetic random number sequence in FIG. 5. In the spectral test of FIG. 6, the obtained arithmetic random number sequence is read in units of 10 bits and converted into a decimal number, and a first point, a second point, . . . , are sequentially plotted such that a first numerical value is set to a horizontal axis coordinate of the first point, such that a second numerical value is set to a vertical axis coordinate of the first point and the horizontal axis coordinate of the second point, and such that a third numerical value is set to the vertical axis coordinate of the second point and the horizontal axis coordinate of the third point, thereby checking whether the periodic characteristic exists on the graph. As illustrated in FIG. 6, in the arithmetic random number generated by LFSR 31, plotted point groups are not uniformly distributed, but the point groups are distributed on specific lines. Therefore, it can be understood that the periodic characteristic exists clearly in the arithmetic random number generated by LFSR 31.

Figure 7:
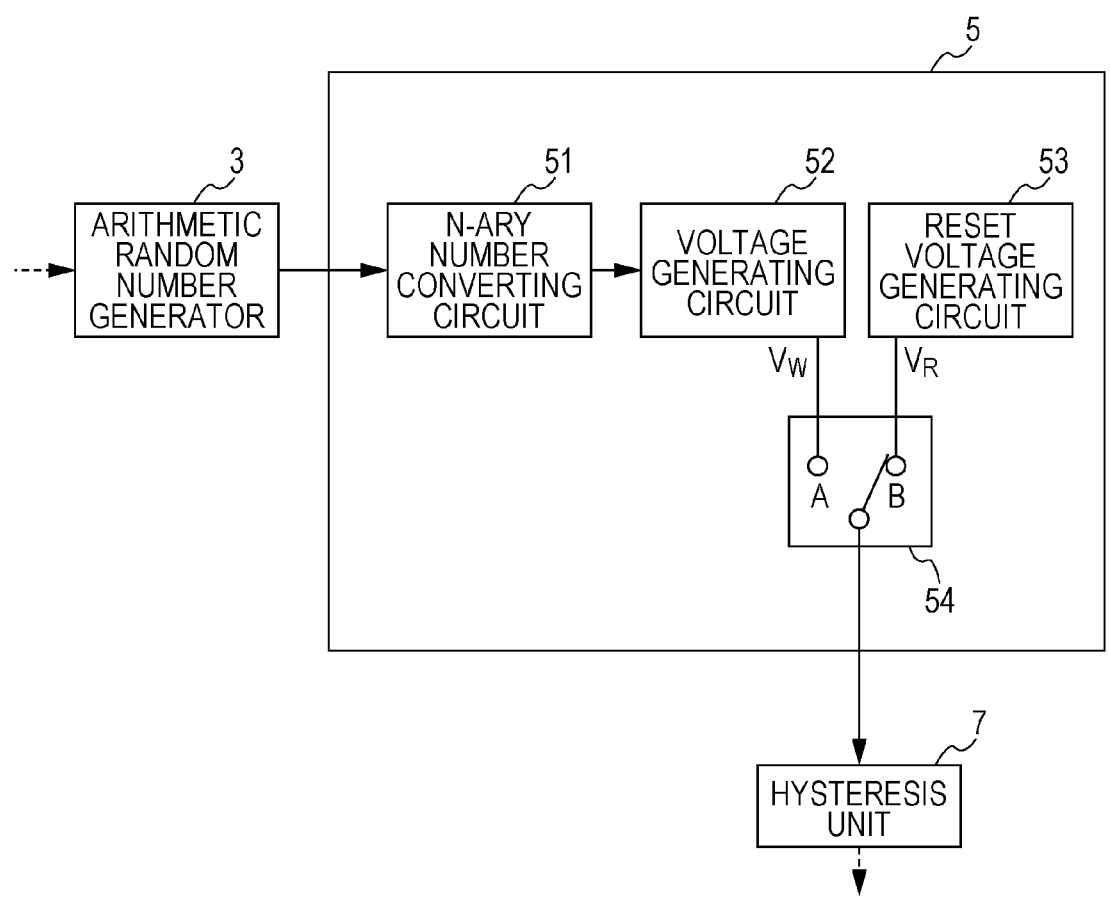
FIG. 7 is a block diagram mainly illustrating a configuration example of the arithmetic random number converter of the random number generating device in FIG. 1.

FIG. 7 is a block diagram mainly illustrating a configuration example of arithmetic random number converter 5 of the random number generating device in FIG. 1. Arithmetic random number converter 5 in FIG. 7 outputs the voltage value that can take at least two levels of gray scale converted according to the value of the arithmetic random number as the value $N_1$ that is one of the alternately-output positive and negative values, and outputs a predetermined fixed value as the value $N_2$ that is the other of the positive and negative values.

Therefore, arithmetic random number converter 5 of the first embodiment includes N-ary number converting circuit 51 and voltage generating circuit 52 as a configuration for outputting the numerical sequence $N_1$. N-ary number converting circuit 51 sequentially reads the predetermined number of bits (M bits) from the arithmetic random number sequence generated by arithmetic random number generator 3, and converts the value read in units of the predetermined number of bits of the arithmetic random number sequence into a predetermined N-ary value. For example, N-ary number converting circuit 51 reads the arithmetic random number sequence in units of M=10 bits, and converts the read 10-bit arithmetic random number sequence into a (N=10) decimal number. In this case, output P of N-ary number converting circuit 51 becomes an integral number having a range of 0≤P≤1023.

Voltage generating circuit 52 generates a voltage $V_W$ proportional to the value P converted into the N-ary number by N-ary number converting circuit 51. Accordingly, for a 10-bit decimal number, the voltage $V_W$ output from voltage generating circuit 52 can take voltage values of 1024 levels of gray scale. For example, voltage generating circuit 52 linearly generates the voltage such that the voltage $V_W$ becomes 0.5 V at the input value P of 0, and such that the voltage $V_W$ becomes 1.5 V at the input value P of 1023. Thus, voltage generating circuit 52 acts as a gray-scale generating circuit that converts the value of the arithmetic random number into the voltage by allocating the output of N-ary number converting circuit 51 to the voltage levels that are of the at least two predetermined levels of gray scale.

There is no particular limitation to the number of bits M used to read the arithmetic random number in N-ary number converting circuit 51 as long as the number of bits M is 1 bit or more. There is no particular limitation to the N-ray number converted by N-ary number converting circuit 51 as long as N is 2 (not converted) or more. However, when the voltage output from arithmetic random number converter 5 has around 1000 levels of gray scale, the voltage can be output by about 1 mV while a difference between the minimum output value and the maximum output value is set to 1 V. For this reason, the number of bits M read by N-ary number converting circuit 51 is set to 10 bits to perform the conversion into the (N=10) decimal number, thereby setting the voltage to the 1024 levels of gray scale. This setting enhances a voltage control characteristic of arithmetic random number converter 5, and the voltage conversion can be performed under the simple control. The same holds true for the output of the current.

The voltage $V_W$ output from voltage generating circuit 52 may be a voltage pulse that is discontinuously output at predetermined time intervals according to the sequentially-input value P or a stepwise voltage output in which the voltage level of the multi-level of gray scale is continuously changed. A well-known circuit configuration (for example, a well-known digital-analog converting circuit) can be applied to N-ary number converting circuit 51 and voltage generating circuit 52.

N-ary number converting circuit 51 may be eliminated when arithmetic random number converter 5 can generate the voltages $V_W$ of at least two levels of gray scale based on the arithmetic random number. For example, arithmetic random number converter 5 may read the arithmetic random number bit by bit, and output a predetermined voltage according to the value (0 or 1) of the read bit (for example, the voltage $V_W$=0.5 V is output when the value of the arithmetic random number is 0 and the voltage $V_W$=1.5 V is output when the value of the arithmetic random number is 1).

Arithmetic random number converter 5 also includes reset voltage generating circuit 53 as a configuration for outputting the numerical sequence $N_2$. Reset voltage generating circuit 53 generates a voltage having a predetermined fixed value as a reset voltage $V_R$. The reset voltage $V_R$ has a constant voltage value in which the polarity is different from that of the voltage $V_W$ output from voltage generating circuit 52. Reset voltage generating circuit 53 can be made using a well-known circuit configuration or a constant voltage source.

A specific method for deciding the voltage $V_W$ and the reset voltage $V_R$ is described below.

Arithmetic random number converter 5 also includes selector switch 54 that alternately outputs numerical sequences $N_1$ and $N_2$ having different polarities. Selector switch 54 alternately switches and outputs the voltage $V_W$ output from voltage generating circuit 52 and the reset voltage $V_R$ output from reset voltage generating circuit 53. That is, selector switch 54 is switched to a state (an output state of the voltage $V_W$) of being connected to a terminal A side when the numerical sequence $N_1$ is output, and selector switch 54 is switched to a state (an output state of the reset voltage $V_R$) of being connected to a terminal B side when the numerical sequence $N_2$ is output.

In the numerical sequence $N_2$, reset voltage generating circuit 53 and selector switch 54 may be eliminated when the voltage value converted according to the value of the arithmetic random number is output. Instead, arithmetic random number converter 5 includes a well-known polarity inverting circuit (not illustrated) that changes the polarity of the voltage $V_W$ sequentially output from voltage generating circuit 52 every time the voltage is changed, and outputs the voltage $V_W$ with the changed polarity. Arithmetic random number converter 5 may output the current instead of the voltages $V_W$ and $V_R$. For example, arithmetic random number converter 5 may include a well-known voltage-current converting circuit (not illustrated) that converts the output voltages $V_W$ and $V_R$ of selector switch 54 into the current, or arithmetic random number converter 5 may include a well-known current generating circuit that generates the current as the gray-scale generating circuit instead of voltage generating circuit 52 and reset voltage generating circuit 53.

Figure 8:
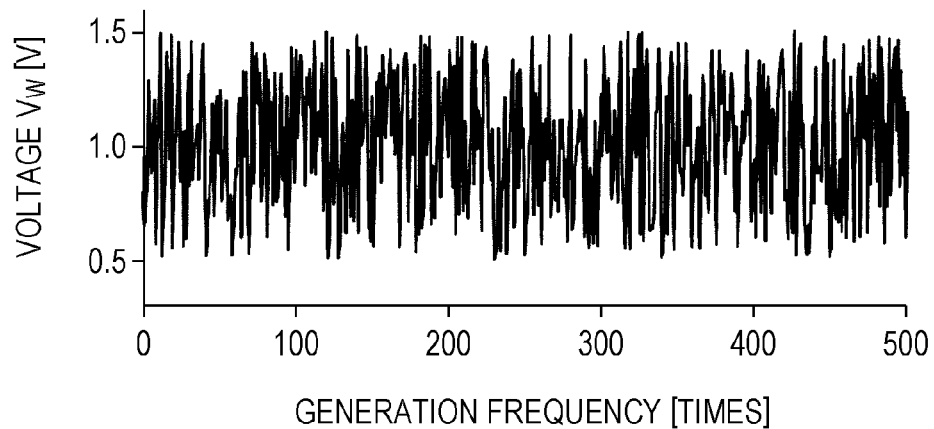
FIG. 8 is a graph illustrating a voltage $V_W$ sequentially output from a voltage generating circuit in FIG. 7.
Figure 9:
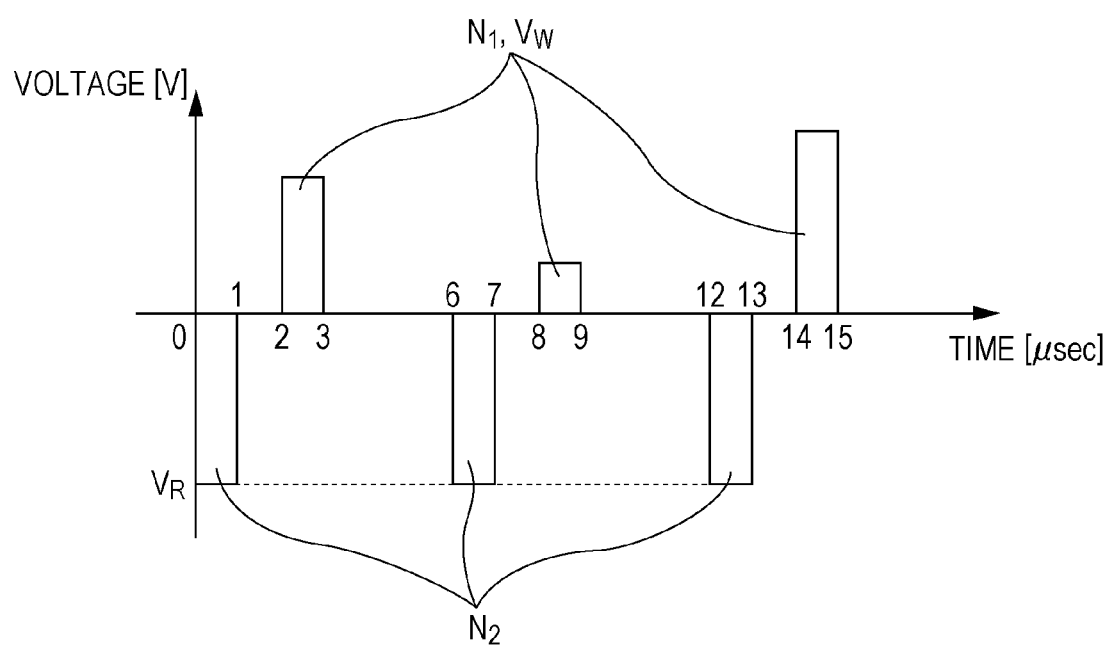
FIG. 9 is a graph illustrating the temporal change in the output of the arithmetic random number converter in FIG. 7.

FIG. 8 is a graph illustrating the voltage $V_W$ sequentially output from voltage generating circuit 52 in FIG. 7, and FIG. 9 is a graph illustrating the temporal change in the output of arithmetic random number converter 5 in FIG. 7. As illustrated in FIG. 8, the periodic characteristic generated in the arithmetic random number is not removed because the voltage $V_W$ sequentially output from voltage generating circuit 52 is one in which the arithmetic random number is converted into the voltage. As illustrated in FIG. 9, as described above, arithmetic random number converter 5 in FIG. 7 alternately outputs the positive voltage $V_W$ that changes based on the arithmetic random number and the reset voltage $V_R$ that is the negative fixed value. In the example of FIG. 9, both pulse widths of the voltages $V_W$ and $V_R$ are set to 1 microsecond.

Figure 10:
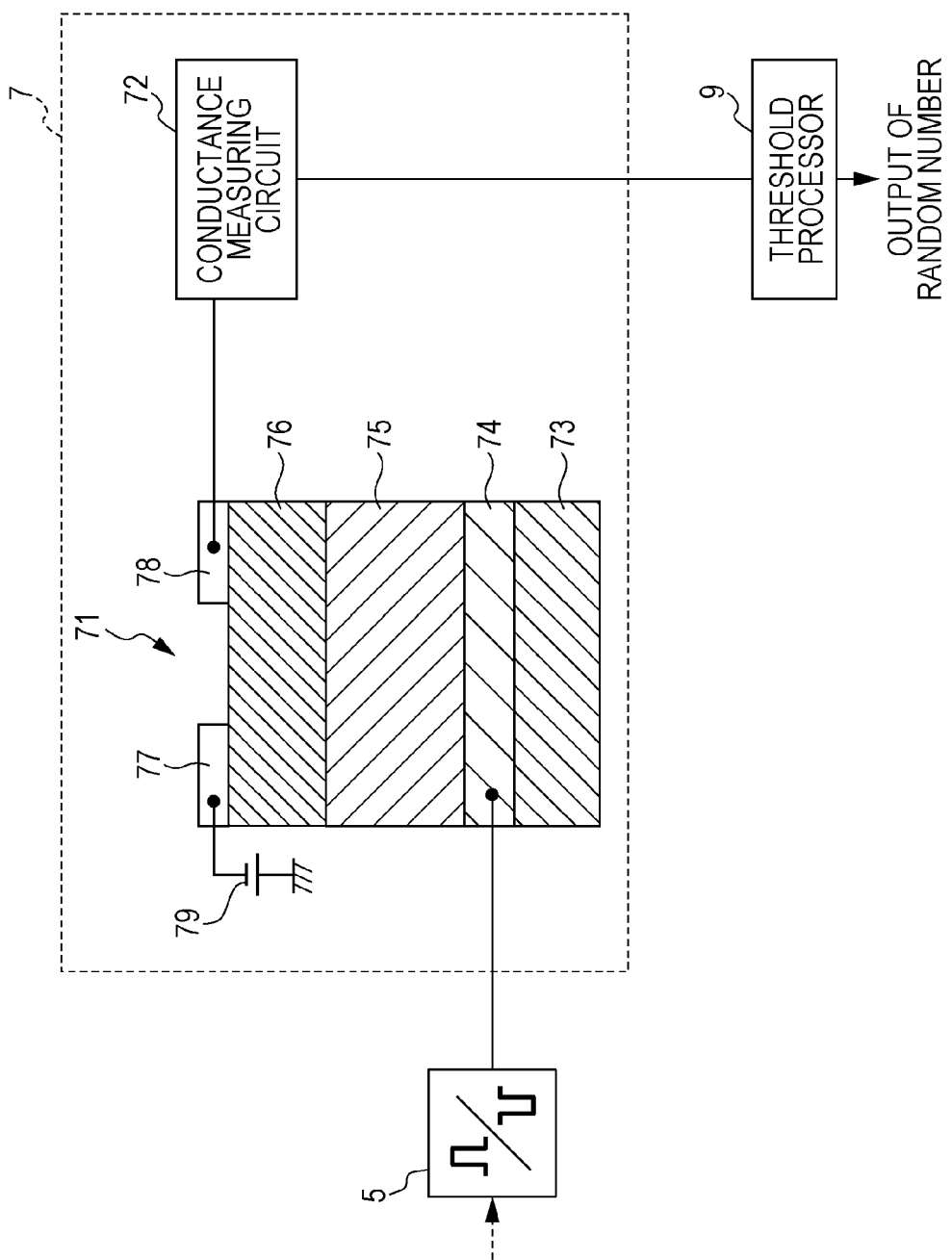
FIG. 10 is a block diagram mainly illustrating a configuration example of the hysteresis unit of the random number generating device in FIG. 1.

FIG. 10 is a block diagram mainly illustrating a configuration example of hysteresis unit 7 of the random number generating device in FIG. 1. As illustrated in FIG. 10, hysteresis unit 7 of the first embodiment includes ferroelectric gate transistor (FeFET) 71 as the hysteresis element, the voltage output from arithmetic random number converter 5 is input to a gate of ferroelectric gate transistor 71, and the conductance (channel conductance) between the source and the drain changes according to the change in voltage input to the gate. Hysteresis unit 7 includes conductance measuring circuit 72 that measures the conductance between the source and the drain of ferroelectric gate transistor 71.

Ferroelectric gate transistor 71 includes substrate 73, gate electrode 74 that is formed on substrate 73, ferroelectric layer 75 that is provided such that gate electrode 74 abuts thereon, semiconductor layer 76 that is formed on ferroelectric layer 75, and two electrodes (source/drain electrode) 77 and 78 that are provided on semiconductor layer 76. In electrodes 77 and 78, voltage source 79 is connected to electrode 77 and conductance measuring circuit 72 is connected to electrode 78.

Ferroelectric gate transistor 71 is not limited to the structure in FIG. 8. For example, semiconductor layer 76 may be formed on substrate 73, ferroelectric layer 75 may be stacked on a part of semiconductor layer 76, gate electrode 74 may be formed on ferroelectric layer 75, and electrodes 77 and 78 may be provided at places where ferroelectric layer 75 is not provided in semiconductor layer 76. Ferroelectric gate transistor 71 may include a configuration in which another configuration (for example, an electrode) is added to the above configuration.

A method for preparing ferroelectric gate transistor 71 in FIG. 10 will now be described. A single-crystal silicon substrate is subjected to heat treatment in an oxygen atmosphere at 1100° C. to form silicon oxide having a thickness of 100 nm on a surface of the substrate, thereby forming substrate 73. For example, as substrate 73, silicon oxide having a thickness of 2 μm may be formed by a chemical vapor deposition method on a silicon substrate in which a CMOS circuit is formed. Then, a conductive film having a thickness of 30 nm and made of platinum is deposited on substrate 73 by a Pulsed Laser Deposition (hereinafter, abbreviated to PLD) method, thereby forming gate electrode 74. The temperature of the substrate is set to 700° C. when the conductive film is deposited. A ferroelectric material of lead zirconate titanate ($Pb(Zr, Ti)O_3$, hereinafter abbreviated to PZT) having a thickness of 450 nm is deposited on gate electrode 74 by the PLD method while substrate 73 is maintained at the temperature of 700° C., thereby forming ferroelectric layer 75. Then, the temperature of substrate 73 is lowered to 400° C., and a semiconductor made of zinc oxide (ZnO) having a thickness of 30 nm is deposited to form semiconductor layer 76. After a patterned resist is formed on semiconductor layer 76, a stacked body constructed with a titanium film having a thickness of 5 nm and a platinum film having a thickness of 30 nm is deposited at room temperature by an electron beam deposition method, and an excess stacked body is removed by a lift-off method, thereby forming electrodes 77 and 78.

In the first embodiment, voltage source 79 connected to electrode 77 applies a voltage of −0.1 V to electrode 77.

Figure 11A:
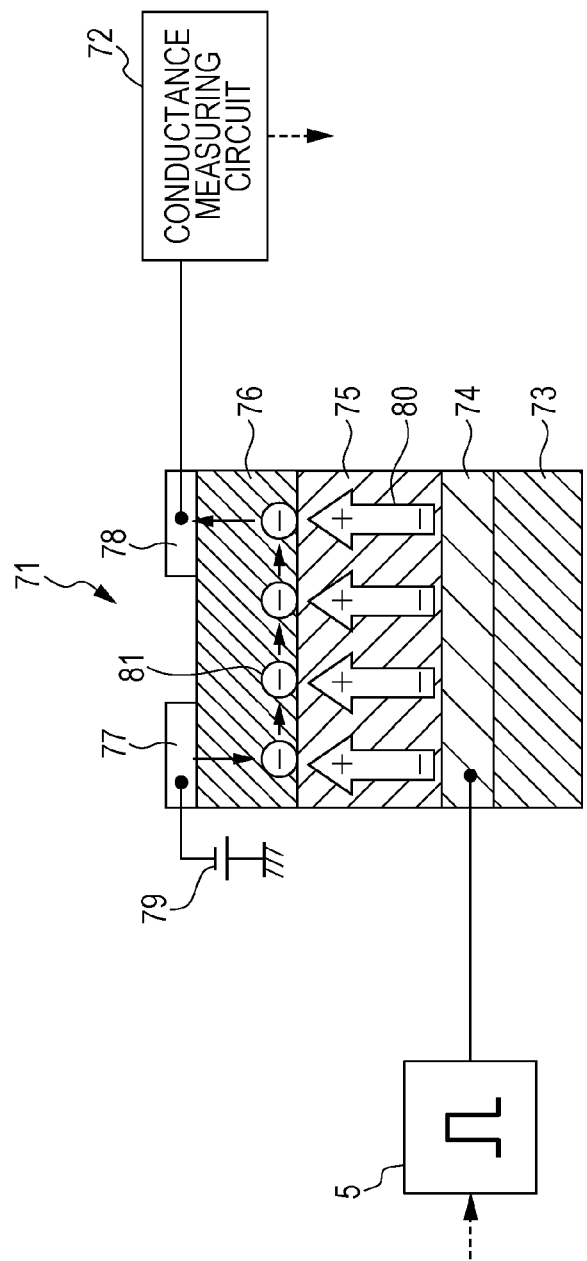
FIG. 11A is a view schematically illustrating operation when a positive voltage pulse $V_W$ is applied to a gate electrode of a ferroelectric gate transistor in FIG. 10.

The operation of ferroelectric gate transistor 71 will be described below. FIG. 11A is a view schematically illustrating the operation when the positive voltage pulse $V_W$ is applied to gate electrode 74 of ferroelectric gate transistor 71 in FIG. 10, and FIG. 11B is a view schematically illustrating the operation when the negative voltage pulse $V_R$ is applied to gate electrode 74 of ferroelectric gate transistor 71 in FIG. 10. In FIGS. 11A and 11B, dielectric polarization 80 generated in ferroelectric layer 75 is schematically illustrated by an arrow as a bias of an atom. Dielectric polarization 80 is illustrated such that the direction in which the atom is biased (the direction in which the atom is positively charged) is oriented toward a tip of the arrow.

FIG. 11A illustrates a state after arithmetic random number converter 5 outputs the sufficiently large positive voltage pulse. In this state, because gate electrode 74 becomes a positive potential with respect to electrodes 77 and 78, dielectric polarization 80 is generated upward as illustrated in FIG. 11A. Therefore, electron 81 in semiconductor layer 76 is attracted near a boundary of ferroelectric layer 75. In this state, when the voltage is applied to electrode 77 based on voltage source 79, an electron is passed between electrodes 77 and 78 (between the source and the drain) through electron 81 attracted near the boundary between ferroelectric layer 75 and semiconductor layer 76. Hereinafter, ease of electron flow between electrode 77 and electrode 78 is referred to as channel conductance G. Because the conductance is expressed by an inverse of the resistance value, a relationship of $G=1/R_{DS}$ holds, where $R_{DS}$ is a resistance value (source-drain resistance value) between electrodes 77 and 78.

On the other hand, FIG. 11B illustrates a state after arithmetic random number converter 5 outputs the sufficiently large negative voltage pulse. In this state, because gate electrode 74 becomes a negative potential with respect to electrodes 77 and 78, dielectric polarization 80 is generated downward as illustrated in FIG. 11B. Therefore, semiconductor layer 76 is depleted. In this state, even if the voltage is applied to electrode 77 based on voltage source 79, the electron is hardly passed between electrodes 77 and 78 due to the existence of the depleted area formed in semiconductor layer 76.

Thus, the channel conductance G increases when the positive voltage pulse is input to gate electrode 74 of ferroelectric gate transistor 71, and the channel conductance G decreases when the negative voltage pulse is input to gate electrode 74. Accordingly, the output (channel conductance) of ferroelectric gate transistor 71 can be modulated according to the output voltage of arithmetic random number converter 5. Magnitude of dielectric polarization 80 in ferroelectric layer 75 depends on the voltage between gate electrode 74 and electrodes 77 and 78, so that the channel conductance of the multi-level of gray scale can be obtained.

Figure 12:
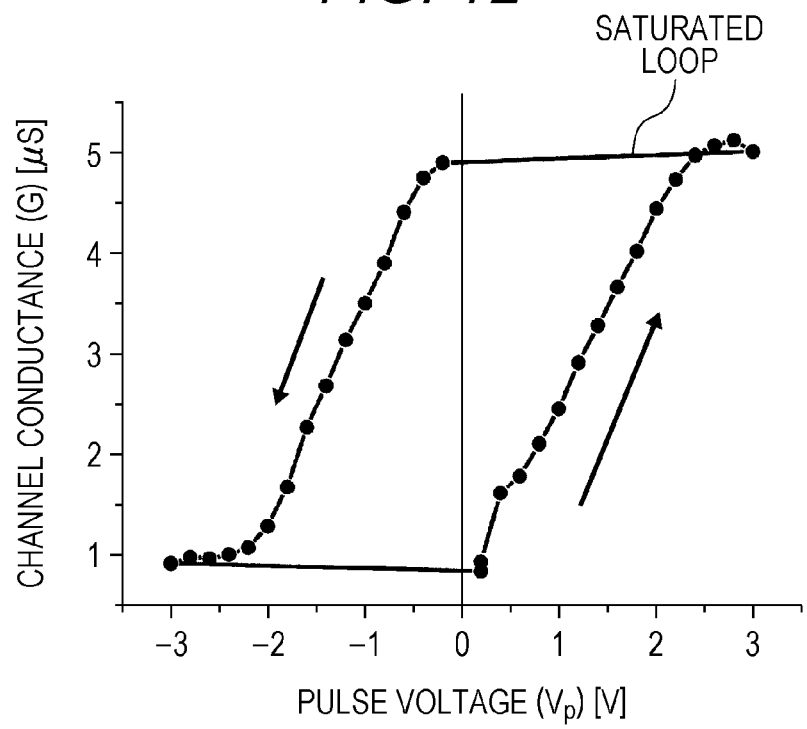
FIG. 12 is a graph illustrating a hysteresis characteristic of the ferroelectric gate transistor in FIG. 10.

A relationship between the voltage applied to ferroelectric layer 75 and dielectric polarization 80 generated by the voltage has the hysteresis. FIG. 12 is a graph illustrating a hysteresis characteristic of ferroelectric gate transistor 71 in FIG. 10. FIG. 12 illustrates a change in channel conductance G when a pulse voltage $V_P$ applied to gate electrode 74 of ferroelectric gate transistor 71 is gradually changed. In the example of FIG. 12, the change in channel conductance G exerts the counterclockwise hysteresis characteristic with respect to the pulse voltage $V_P$ applied to gate electrode 74 of ferroelectric gate transistor 71.

When ferroelectric gate transistor 71 is used as hysteresis unit 7, the output having the hysteresis characteristic can be obtained with the multi-level of gray scale based on the voltage output from arithmetic random number converter 5. Accordingly, hysteresis unit 7 in which the output to input largely changes can easily be made with a simple configuration.

Figure 13:
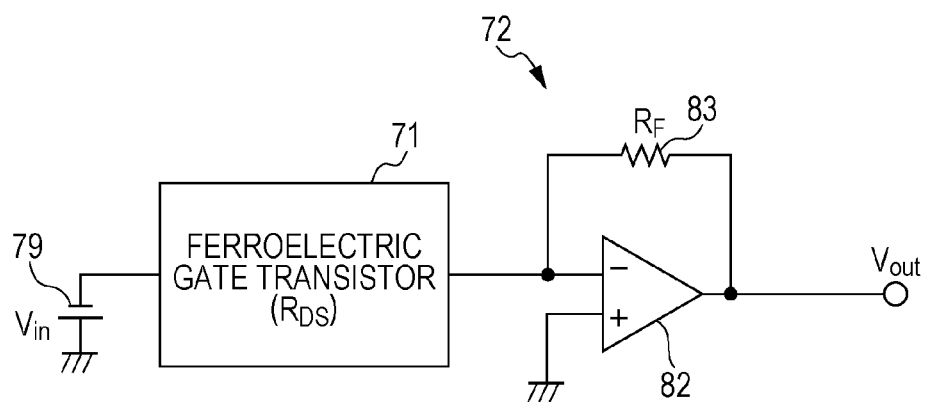
FIG. 13 is a circuit diagram illustrating a configuration example of a conductance measuring circuit of the hysteresis unit in FIG. 10.

FIG. 13 is a circuit diagram illustrating a configuration example of conductance measuring circuit 72 of hysteresis unit 7 in FIG. 10. As illustrated in FIG. 13, conductance measuring circuit 72 of the first embodiment is constructed with an amplifier circuit in which an operational amplifier is used. Specifically, conductance measuring circuit 72 includes operational amplifier 82 and resistance element 83. In operational amplifier 82, one (inverting input terminal) of an input terminal pair is connected to electrode 78, and the other (non-inverting input terminal) of the input terminal pair is connected to a predetermined voltage source (ground voltage source). Resistance element 83 is connected between the inverting input terminal and output terminal of operational amplifier 82.

The current passed between the source and drain of ferroelectric gate transistor 71 based on a voltage $V_{in}$ of voltage source 79 is input to the inverting input terminal of operational amplifier 82. Assuming that RF is a resistance value of resistance element 83, an output voltage $V_{out}$ of conductance measuring circuit 72 is obtained by the following equation using the source-drain resistance value $R_{DS}$.

[Mathematical Formula 1]

$$V_{out} = -\frac{R_F}{R_{DS}} V_{in} \quad (1)$$

Using the equation (1), the channel conductance G in FIG. 12 is calculated from a measurement result of the output voltage $V_{out}$ of conductance measuring circuit 72 for $V_{in} = -0.1$ V.

The obtained channel conductance G is binarized by threshold processor 9. In the first embodiment, threshold processor 9 uses an average value of the previously-output values as a binarizing threshold with respect to the value (channel conductance G) sequentially output from hysteresis unit 7. For example, the average value of the channel conductance G that is calculated 100 times before the channel conductance G to be binarized is output is used as the threshold of the channel conductance G to be binarized. Threshold processor 9 outputs 1 when the value of the channel conductance G to be binarized is greater than or equal to the threshold, and threshold processor 9 outputs 0 when the value of the channel conductance G to be binarized is less than the threshold. The value sequentially output from threshold processor 9 becomes the random number sequence generated by random number generating device 1 of the first embodiment. There is no limitation to the threshold, but a predetermined value (fixed value) may be decided as the threshold or the threshold may be updated every predetermined times using an average value.

The more specific method for deciding the voltage $V_W$ and the reset voltage $V_R$ in the first embodiment will be described below.

As described above, the signal input to hysteresis unit 7 is adjusted such that the input and output operation of hysteresis unit 7 is performed in the minor loop of the hysteresis characteristic of hysteresis unit 7, whereby the present disclosure obtains the output that changes intricately according to the history. The inventors of the present disclosure have found that the values of the input voltages $V_W$ and $V_R$ are set as follows in order to stably obtain the operation in the minor loop.

Figure 14:
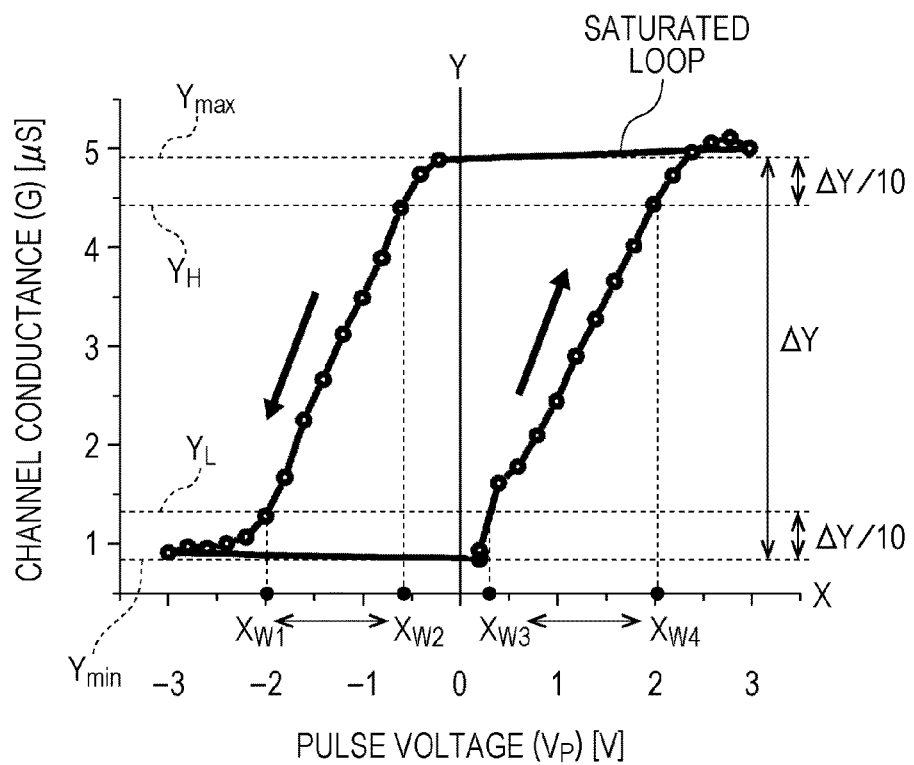
FIG. 14 is a conceptual view illustrating the case where an input signal is adjusted based on the hysteresis characteristic in FIG. 12.

FIG. 14 is a conceptual view illustrating the case where the input signal is adjusted based on the hysteresis characteristic in FIG. 12. An X-axis (horizontal axis) expresses the pulse voltage $V_P$ that is the input value, and a Y-axis (vertical axis) expresses the channel conductance G that is the output value. It is assumed that $Y_{min}$ is the minimum value on the Y-axis (at $V_P=0$) in the saturated loop, that $Y_{max}$ is the maximum value, and that $\Delta Y (=Y_{max}-Y_{min})$ is a difference between $Y_{max}$ and $Y_{min}$. At this point, an input value X is adjusted such that a value Y output from hysteresis unit 7 falls within a range located inside the saturated loop by 1/10 of the difference $\Delta Y$ between the maximum value $Y_{max}$ and the minimum value $Y_{min}$. That is, the input value of hysteresis unit 7 is set so as to fall within the range from an output minimum value $Y_L=Y_{min}+\Delta Y/10$ to an output maximum value $Y_H=Y_{max}-\Delta Y/10$.

Specifically, the range of the input value X constituting the output range of $Y_L \leq Y \leq Y_H$ is divided into a positive range and a negative range. In the saturated loop, assuming that $X_{W1}$, $X_{W2}$, $X_{W3}$, and $X_{W4}$ are input values X in the ascending order when the output value Y becomes $Y_H$ and $Y_L$, the negative range that can be taken by the input value X becomes a range of $X_{W1} \leq X \leq X_{W2}$, and the positive range that can be taken by the input value X becomes a range of $X_{W3} \leq X \leq X_{W4}$.

Accordingly, the obtained positive and negative ranges in the input value X are applied to the numerical sequences $N_1$ and $N_2$ that are the output of arithmetic random number converter 5, which allows the output value Y of hysteresis unit 7 to be intricately changed.

That is, the ranges of the numerical sequences $N_1$ and $N_2$ are expressed as follows.

$$X_{W1} \leq N_1 \leq X_{W2} \text{ and } X_{W3} \leq N_2 \leq X_{W4} \quad (2)$$

or $$X_{W3} \leq N_1 \leq X_{W4} \text{ and } X_{W1} \leq N_2 \leq X_{W2} \quad (3)$$

In the first embodiment, because of $N_1=V_W>0$ and $N_2=V_R<0$, the ranges of the voltages $V_W$ and $V_R$ are obtained as follows.

$$X_{W3} \leq V_W \leq X_{W4} \text{ and } X_{W1} \leq V_R \leq X_{W2} \quad (4)$$

Figure 26:
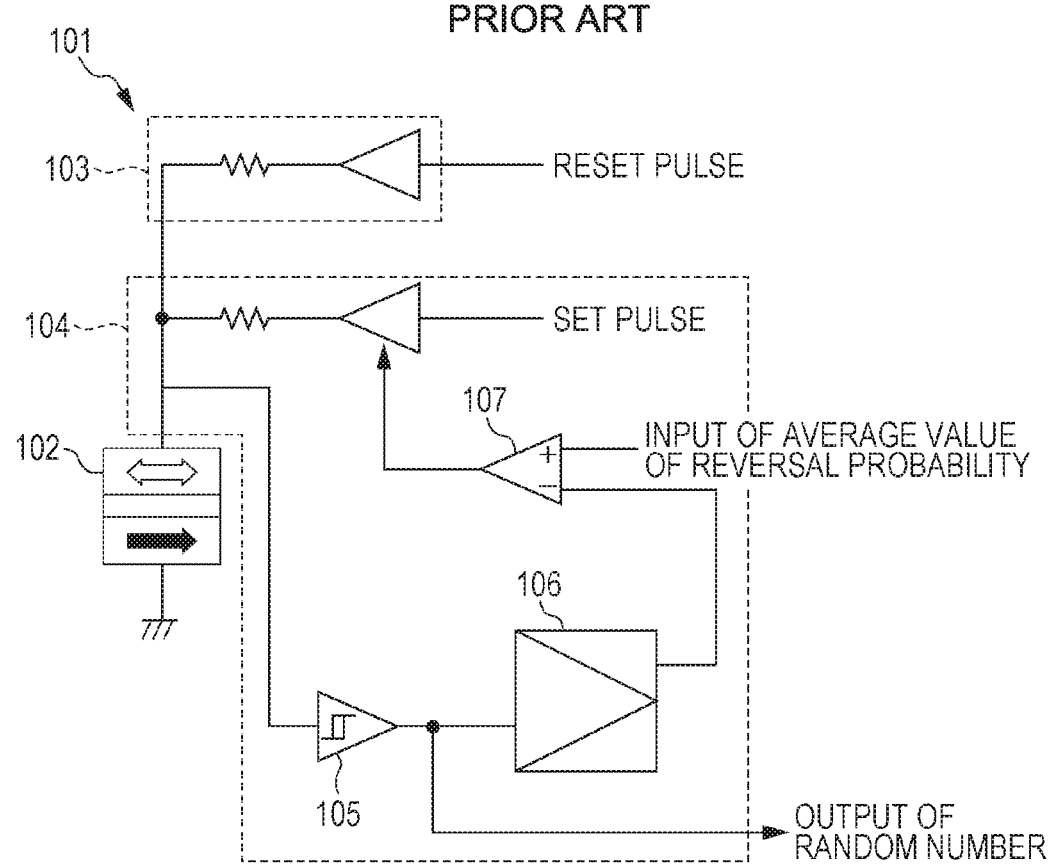
FIG. 26 is a view illustrating an outline configuration of a conventional random number generating device in which a thermal noise is used.
Figure 27:
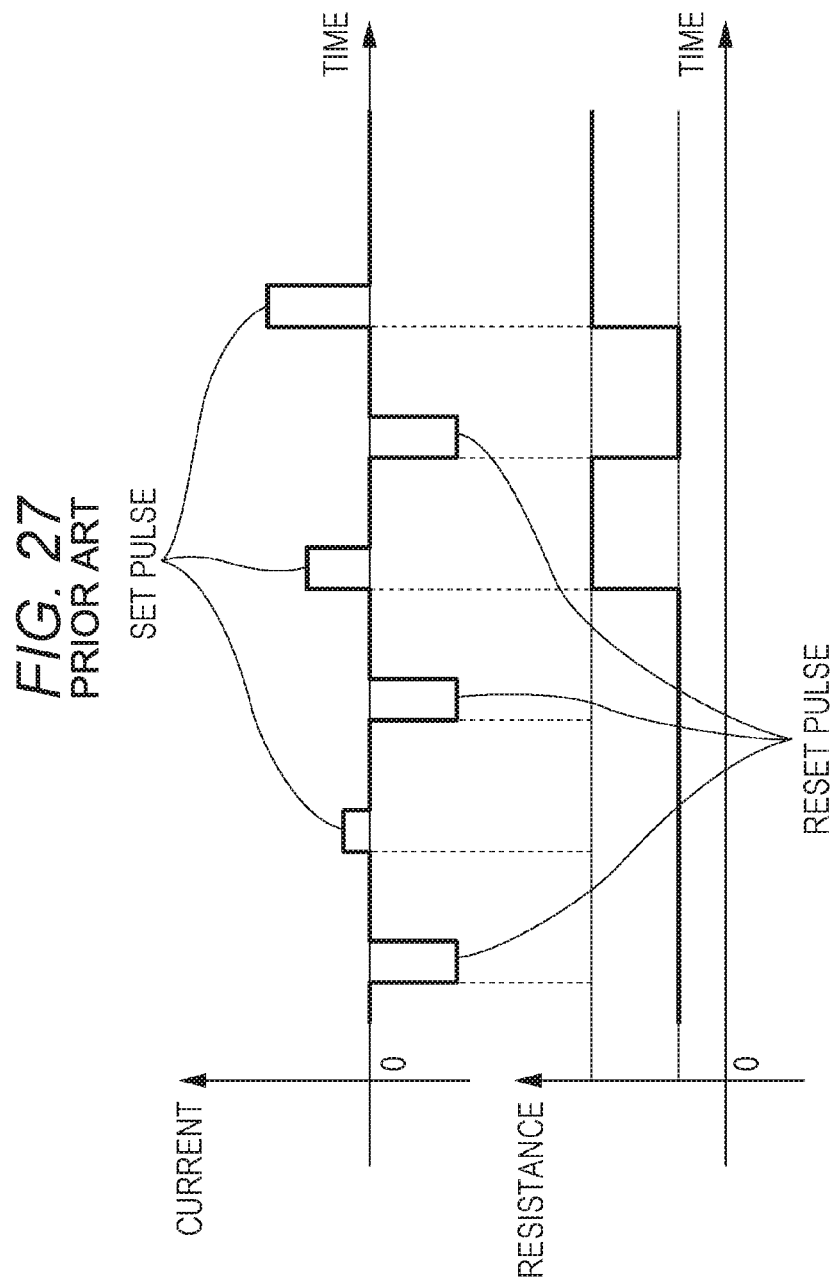
FIG. 27 is a view illustrating a method for driving the random number generating device in FIG. 26.
Figure 28:
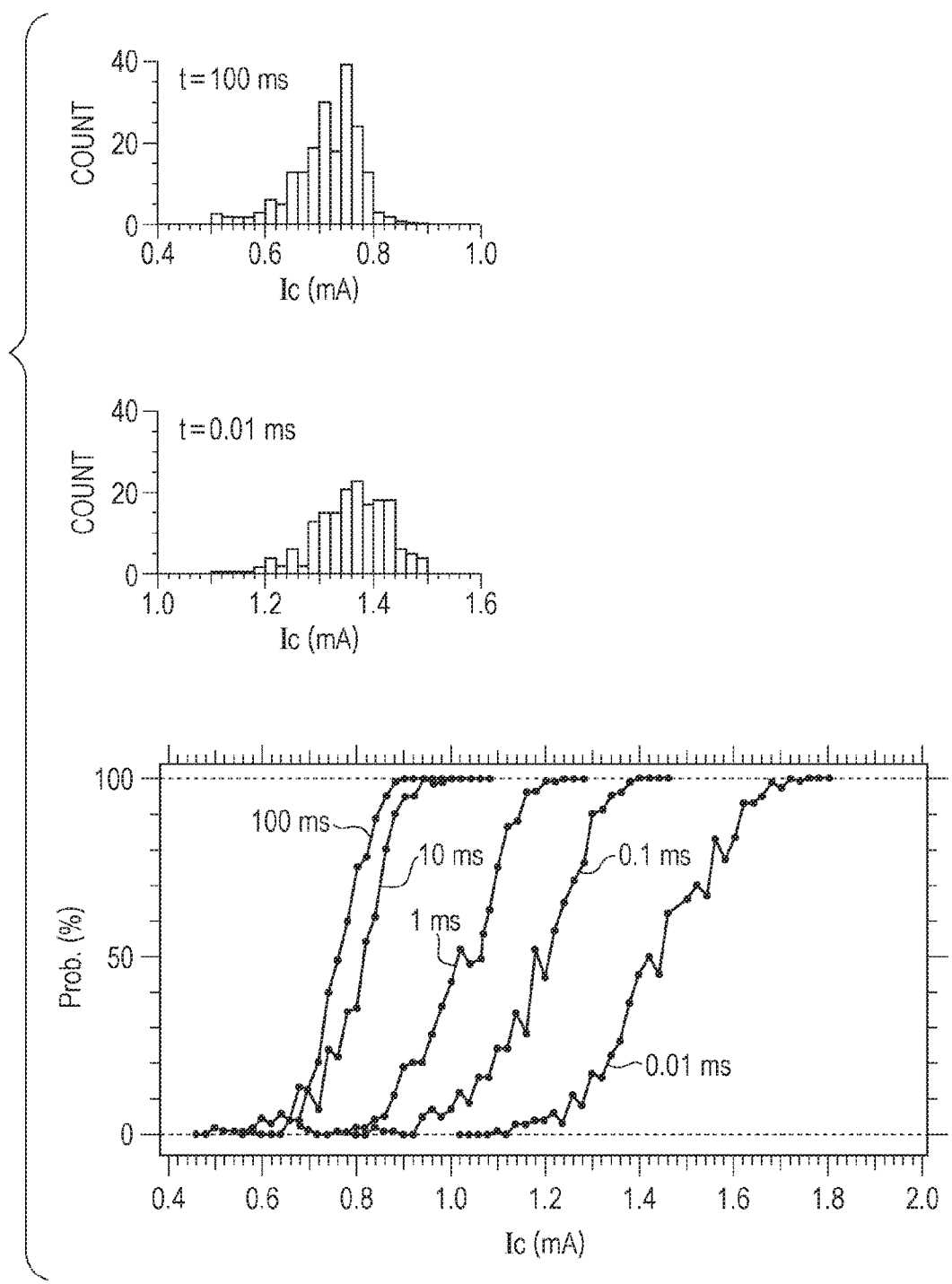
FIG. 28 is a view illustrating a method for controlling the random number generating device in FIG. 26.
Figure 29:
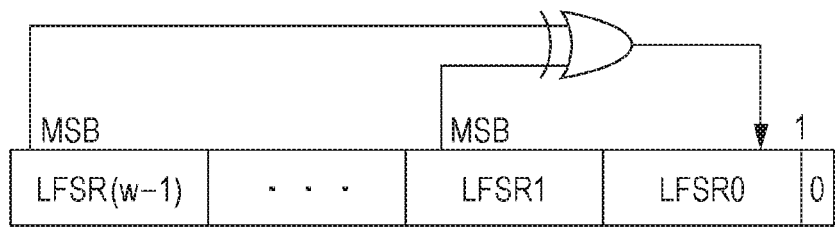
FIG. 29 is a view illustrating an outline configuration of a conventional random number generating device in which an arithmetic random number is used.

As described above, in the configuration of the present disclosure, the positive and negative values are alternately input, and the output value of arithmetic random number converter 5 is adjusted such that the input values fall within the minor loop of the hysteresis characteristic, so that the output value of hysteresis unit 7 can be largely varied. On the other hand, in the conventional random number generating device in which the thermal noise is used as illustrated in FIG. 26, the reset pulse is provided to the magnetization free layer as the method for aligning (initializing) the magnetization direction provided to the magnetization free layer of the magnetoresistive element. The configuration of the present disclosure in which the positive and negative values are alternately input in order to forcibly increase the output variation is based on a technical thought largely different from that of the conventional random number generating device in which the thermal noise is used.

Instead of applying the expression (2) or (3), the range of the minor loop that is more suitable for the hysteresis characteristic of the hysteresis element used in hysteresis unit 7 may separately be defined.

Evaluation of Random Number Generated in the First Embodiment

A plurality of evaluations were performed to the random number generated by random number generating device 1 of the first embodiment. The evaluation results will be described below.

Figure 15:
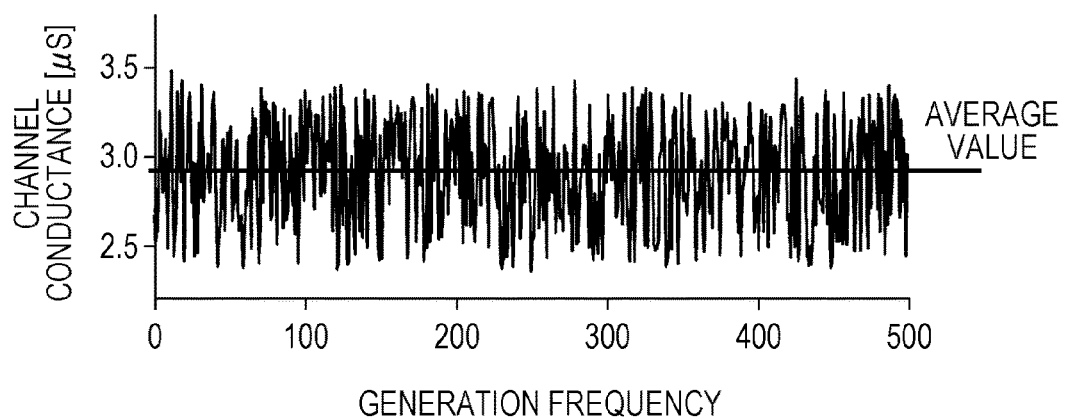
FIG. 15 is a graph illustrating channel conductance sequentially output from the conductance measuring circuit in FIG. 13.

FIG. 15 is a graph illustrating channel conductance sequentially output from conductance measuring circuit 72 in FIG. 13. The graph in FIG. 15 illustrates the result in which the output voltage $V_{out}$ output from conductance measuring circuit 72 is converted into the channel conductance using the equation (1) when $V_R=-1$ V and $0.5$ V $\leq V_W \leq 1.5$ V are input to gate electrode 74 of ferroelectric gate transistor 71. The output voltage $V_{out}$ is a value that is measured after 1 microsecond elapses since the voltages $V_W$ and $V_R$ become 0 V. When a waveform of the channel conductance in FIG. 15 is compared to a voltage waveform of voltage generating circuit 52 in FIG. 8, both the waveforms seem to be substantially similar to each other.

Figure 16:
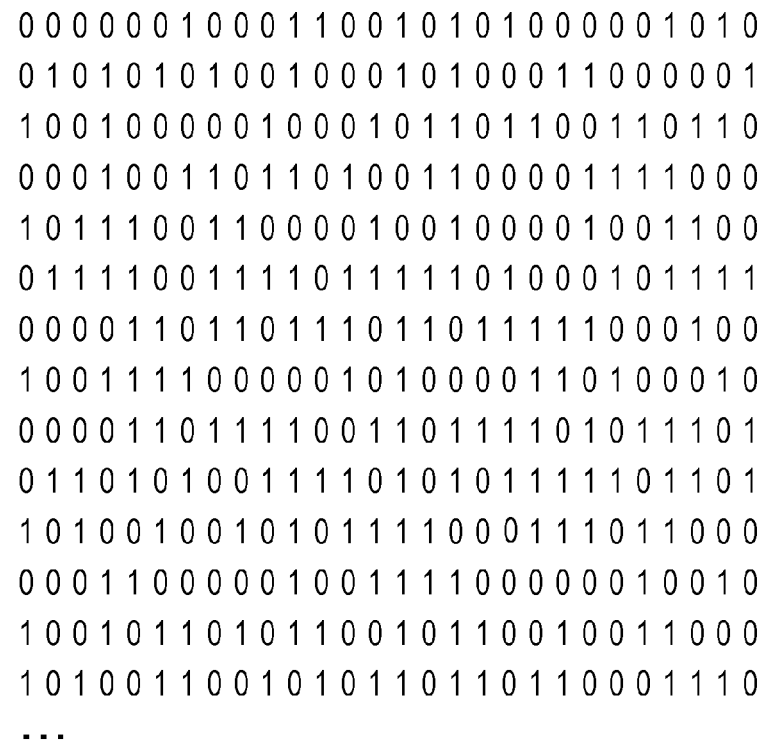

FIG. 16 is a view illustrating the arithmetic random number sequence generated by random number generating device 1 in FIG. 1. In FIG. 16, 0 and 1 seems to be randomly generated at a glance. However, there seems to be not so much of a difference between the arithmetic random number sequence in FIG. 16 and the arithmetic random number sequence in FIG. 5. Some evaluation results of the random number sequence generated by random number generating device 1 will be described below.

Figure 17:
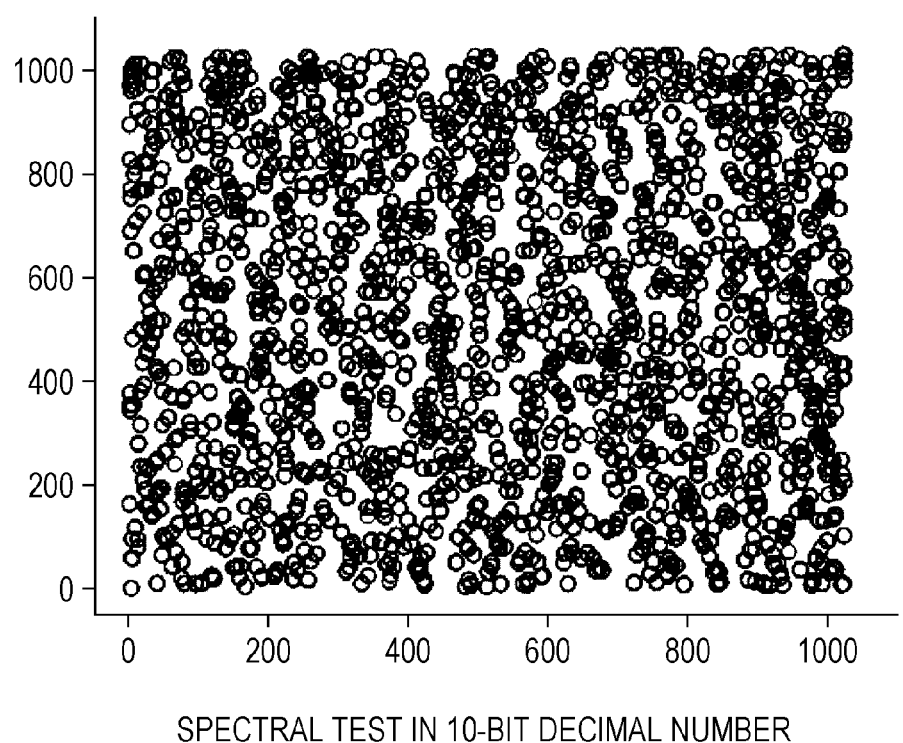
FIG. 17 is a graph illustrating the spectral test result of the arithmetic random number sequence in FIG. 16.

FIG. 17 is a graph illustrating the spectral test result of the arithmetic random number sequence in FIG. 16. In FIG. 17, similarly to the spectral test in FIG. 6, a plurality of points are plotted based on the random number sequence generated by random number generating device 1. The distribution of the plotted point group that is observed for the arithmetic random number in FIG. 6 on the specific line is not observed in the graph of FIG. 17, but the plotted point group is substantially uniformly distributed.

The evaluation is further performed using a Morishita index $I_\delta$ that is well known as an index exhibiting a variation of the plotted point group. The Morishita index $I_\delta$ is a method in which the distribution of the plotted point group in FIG. 17 is divided into predetermined sections to perform the evaluation using the number of plots included in each section. The Morishita index $I_\delta$ is defined by the following equation.

[Mathematical Formula 2]

$$I_\delta = q \sum_{j=1}^{q} x_j(x_j - 1) / \sum_{j=1}^{q} x_j \left( \sum_{j=1}^{q} x_j - 1 \right) \quad (5)$$

Where q is the number of sections and $x_j$ is the number of plotted points in a j-th section.

Figure 18:
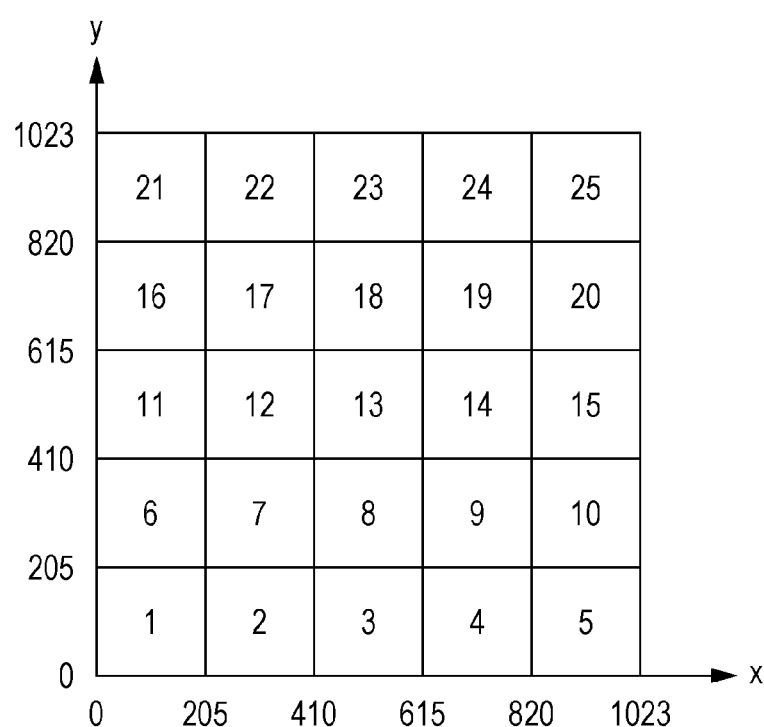
FIG. 18 is a view illustrating a mode in which the graph in FIG. 17 is divided into a plurality of sections.

FIG. 18 is a view illustrating a mode in which the graph in FIG. 17 is divided into the plurality of sections. As illustrated in FIG. 18, when the Morishita index $I_\delta$ is applied to the distribution in FIG. 17, the graph in FIG. 17 is divided into five sections in each of the horizontal and vertical axis directions, and the evaluation is performed to 25 sections (q=25) in total. As illustrated in FIG. 18, section numbers (corresponding to j in the equation (5)) 1 to 25 are allocated to the sections.

The Morishita index becomes $I_\delta=1$ in a Poisson distribution in which a plurality of points are uniformly distributed at random on a plane. In the dividing mode of FIG. 18, because areas of the section numbers 5, 10, 15, and 20 to 25 are slightly smaller than those of other section numbers, the area is corrected in calculating the Morishita index $I_\delta$. The inventors of the present disclosure have determined that, when the Morishita index $I_\delta$ obtained by the calculation falls within the range of $0.98 \leq I_\delta \leq 1.02$, the plurality of points are sufficiently uniform to be able to exclude the periodic characteristic of the random number. For example, when the Morishita index $I_\delta$ is calculated based on the distribution of the arithmetic random number in FIG. 6, $I_\delta=1.05$ is obtained and the distribution of the arithmetic random number is determined to be a lack of uniformity.

On the other hand, when the Morishita index $I_\delta$ is calculated to the distribution of the arithmetic random number in FIG. 17, $I_\delta=0.9998$ is obtained. Not only the distribution of the arithmetic random number generated by random number generating device 1 of the first embodiment falls within the range of $0.98 \leq I_\delta 1.02$ that is a criterion, but also the distribution is extremely close to $I_\delta=1$ that is the Poisson distribution. Accordingly, it is clear to obtain the good uniformity.

Verification was also performed based on FIPS (Federal Information Processing Standardization) 140 that defines specifications of security requirements concerning a cipher. Table 1 illustrates a verification result. In the verification, when a content of a "test" falls within a range for a number of times indicated by an "acceptable range" with respect to the random number sequence of 20000 bits, an acceptable determination is made. As can be seen from Table 1, all the measurement results fall within the acceptable range.

TABLE 1

| Test | | Acceptable range | Measurement result | Acceptable level |
|---|---|---|---|---|
| Mono-bit test | | 9725 to 10043 | 10005 | ○ |
| Run test | 1 has 1 outcome | 2315 to 2685 | 2410 | ○ |
| | 1 has 2 outcomes | 1114 to 1386 | 1115 | ○ |
| | 1 has 3 outcomes | 527 to 723 | 601 | ○ |
| | 1 has 4 outcomes | 240 to 384 | 380 | ○ |
| | 1 has 5 outcomes | 103 to 209 | 184 | ○ |
| | 1 has 6 outcomes or more | 103 to 209 | 166 | ○ |
| | 0 has 1 outcome | 2315 to 2685 | 2386 | ○ |
| | 0 has 2 outcomes | 1114 to 1386 | 1212 | ○ |
| | 0 has 3 outcomes | 527 to 723 | 624 | ○ |
| | 0 has 4 outcomes | 240 to 384 | 306 | ○ |
| | 0 has 5 outcomes | 103 to 209 | 156 | ○ |
| | 0 has 6 outcomes or more | 103 to 209 | 172 | ○ |
| Long run test | The number of longest outcomes of 1 | <26 | 20 | ○ |
| | The number of longest outcomes of 0 | <26 | 19 | ○ |

As illustrated by the plurality of test results, random number generating device 1 of the first embodiment can generate the extremely good random number having no periodic characteristic.

Second Embodiment

Figure 19:
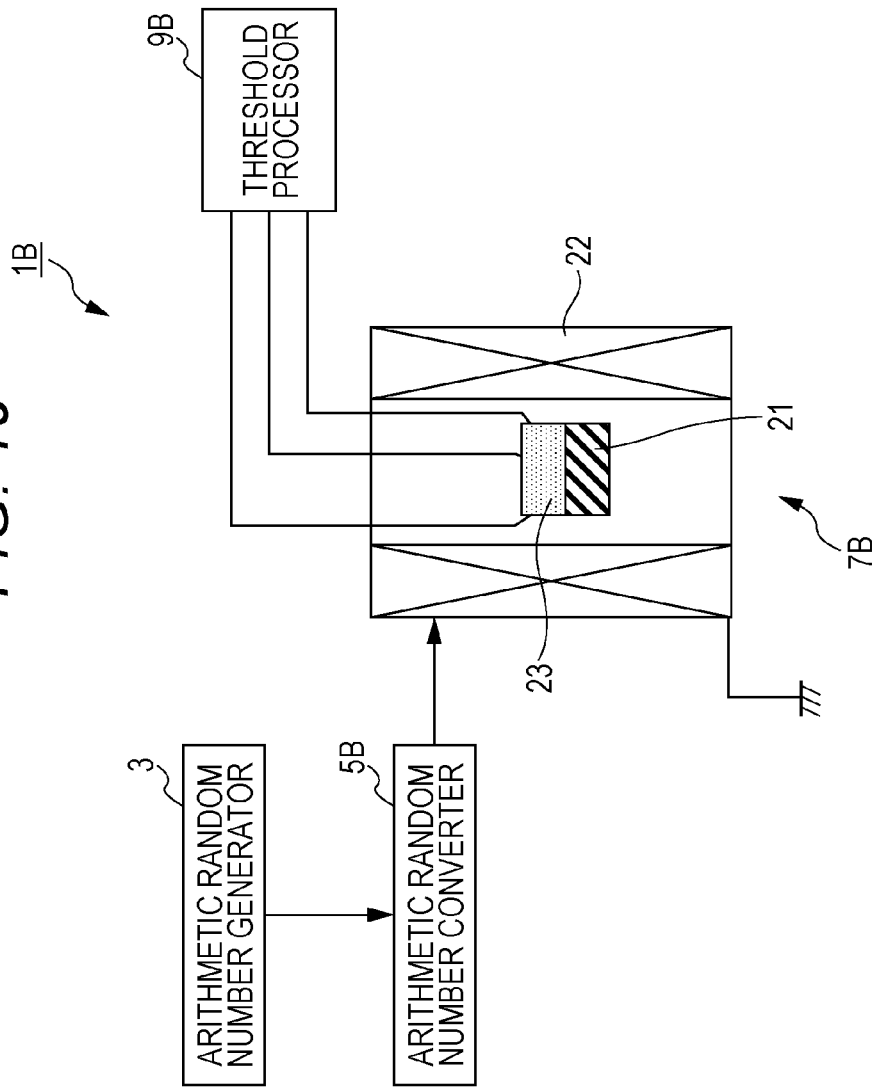
FIG. 19 is a view illustrating an outline configuration of a random number generating device according to a second embodiment of the present disclosure.

A second embodiment of the present disclosure will be described below. FIG. 19 is a view illustrating an outline configuration of random number generating device 1B according to the second embodiment of the present disclosure. In the second embodiment, the configuration identical to that of the first embodiment is designated by the identical numeral, and the description is omitted. As illustrated in FIG. 19, random number generating device 1B of the second embodiment differs from random number generating device 1 of the first embodiment in the following points. That is, arithmetic random number converter 5B is configured to output the current, hysteresis unit 7B includes magnetic body 21 as the hysteresis element, and the magnetic field is generated in magnetic body 21 based on the current output from arithmetic random number converter 5B to change the magnetization state of magnetic body 21. Threshold processor 9B of the second embodiment generates the random number by binarizing the change in the magnetization state of magnetic body 21.

Magnetic body 21 is formed of an iron (Fe)-based spinel type thin film that contains cobalt (Co) and nickel (Ni) and is formed on a glass substrate. For example, magnetic body 21 is formed by reactive sputtering. For example, an iron target is sputtered in an oxygen atmosphere to form an $Fe_3O_4$ layer having a thickness of 6 nm on the glass substrate in which the temperature is maintained at 200° C., and then cobalt and nickel targets are sputtered in the oxygen atmosphere to form an oxide layer that has a thickness of 0.5 nm and contains cobalt and nickel, and repetition of the above processes are alternately performed 70 times, thereby forming magnetic body 21 as a multi-layered film. Hysteresis unit 7B includes magnetic field generator 22 that generates the magnetic field in magnetic body 21 and magnetization state measuring unit 23 that measures the magnetization state of magnetic body 21. For example, magnetic field generator 22 is a coil. For example, magnetization state measuring unit 23 is a Hall element. Similarly to arithmetic random number converter 5 of the first embodiment, arithmetic random number converter 5B converts the arithmetic random number into current pulses of at least two levels of gray scale having different lengths based on the arithmetic random number, and applies the current pulses to magnetic field generator 22. Magnetic field generator 22 generates the magnetic field in a surrounding of magnetic body 21 according to the length of the applied current pulse.

Figure 20:
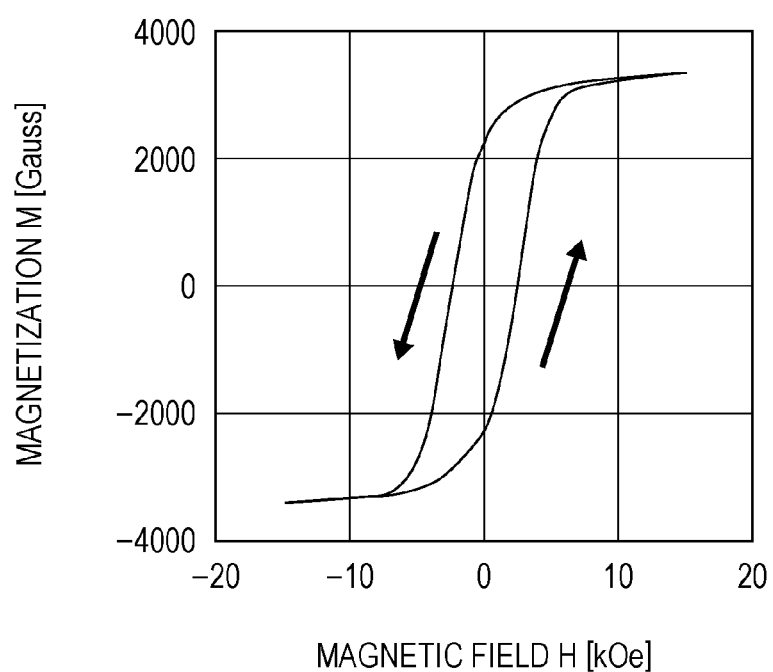
FIG. 20 is a graph illustrating a hysteresis characteristic of a magnetic body used in the hysteresis unit in FIG. 19.

FIG. 20 is a graph illustrating a hysteresis characteristic of magnetic body 21 used in hysteresis unit 7B in FIG. 19. FIG. 20 illustrates a magnetization curve when the magnetic field is applied in the direction perpendicular to magnetic body 21. As illustrated in FIG. 20, magnetic body 21 has the hysteresis characteristic of the value of the magnetization to the magnetic field. Accordingly, the current pulse output from arithmetic random number converter 5B is adjusted, and the magnetic field is provided to the surrounding of magnetic body 21 so as to track on the minor loop, so that the arithmetic random number having no periodic characteristic can be generated without generating the biased generation frequency similarly to the first embodiment.

Third Embodiment

Figure 21:
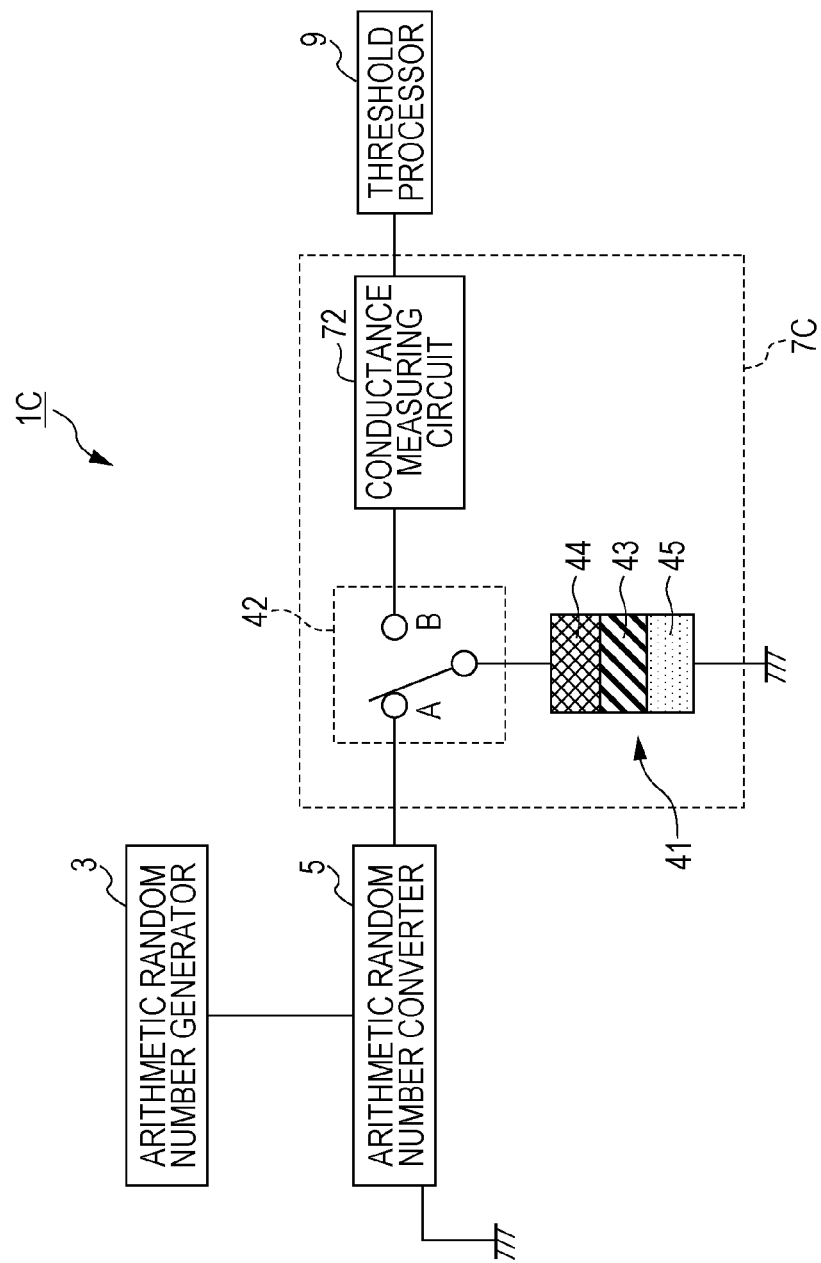
FIG. 21 is a view illustrating an outline configuration of a random number generating device according to a third embodiment of the present disclosure.

A third embodiment of the present disclosure will be described below. FIG. 21 is a view illustrating an outline configuration of random number generating device 1C according to the third embodiment of the present disclosure. In the third embodiment, the configuration identical to that of the first embodiment is designated by the identical numeral, and the description is omitted. As illustrated in FIG. 21, random number generating device 1C of the third embodiment differs from random number generating device 1 of the first embodiment in that hysteresis unit 7C includes resistance change element 41 in which the resistance value changes by applying the voltage output from arithmetic random number converter 5 as the hysteresis element.

Resistance change element 41 includes resistance change layer 43 and electrodes 44 and 45 that are provided so as to sandwich resistance change layer 43 therebetween. For example, resistance change layer 43 is made of aluminum oxide and the electrodes 44 and 45 are made of platinum. Both the electrodes 44 and 45 have a thickness of about 30 nm. For example, resistance change layer 43 is formed by repeating a process of growing an aluminum thin film having a thickness of 3 nm and a process of performing the heat treatment at 500° C. in the oxygen atmosphere 7 times.

Hysteresis unit 7C also includes selector switch 42 that connects electrode 44 of resistance change element 41 to one of arithmetic random number converter 5 and conductance measuring circuit 72. Electrode 45 of resistance change element 41 is maintained at a predetermined voltage (for example, a ground voltage).

Figure 22:
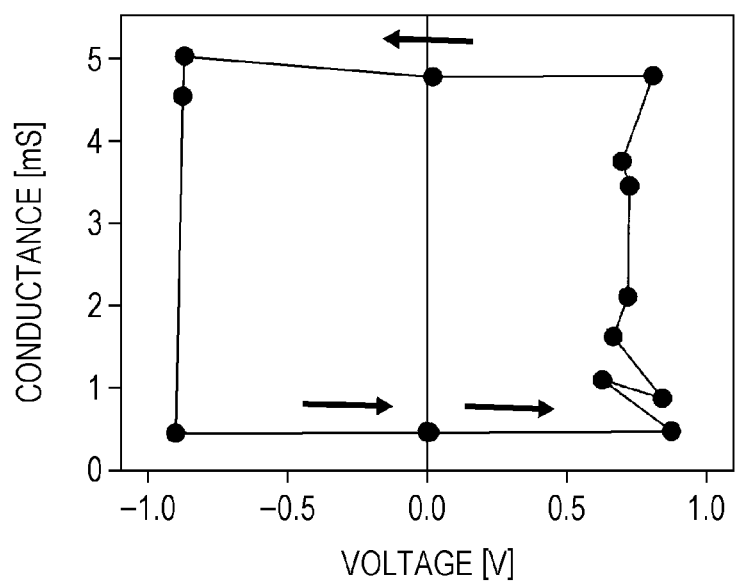
FIG. 22 is a graph illustrating a hysteresis characteristic of a resistance change element used in the hysteresis unit in FIG. 21.

FIG. 22 is a graph illustrating a hysteresis characteristic of resistance change element 41 used in hysteresis unit 7C in FIG. 21. As illustrated in FIG. 22, resistance change element 41 has the hysteresis characteristic of the resistance value, namely, the conductance value to the applied voltage. In changing the conductance of resistance change element 41, selector switch 42 is switched onto the terminal A side to connect arithmetic random number converter 5 and resistance change element 41, thereby applying the output voltage of arithmetic random number converter 5 to resistance change element 41. In the case where the conductance of resistance change element 41 is measured, selector switch 42 is switched onto the terminal B side to connect resistance change element 41 and conductance measuring circuit 72, thereby measuring the conductance of resistance change element 41 using conductance measuring circuit 72. Threshold processor 9 generates the arithmetic random number by binarizing the conductance measured by conductance measuring circuit 72 based on a predetermined threshold.

As illustrated in FIG. 22, resistance change element 41 has a hysteresis characteristic. Therefore, the voltage pulse output from arithmetic random number converter 5 is adjusted, and the voltage is applied to resistance change element 41 so as to track on the minor loop, so that the arithmetic random number having no periodic characteristic can be generated without generating the biased generation frequency similarly to the first embodiment.

COMPARATIVE EXAMPLE

A comparative example will be described below in order to demonstrate the effect of the present disclosure obtained by the alternate input of the positive and negative values to hysteresis units 7, 7B, and 7C.

In the comparative example, an evaluation result of the arithmetic random number generated by continuously inputting the voltage having the identical polarity is illustrated instead of the output voltage waveform (numerical sequence $N_1$ and $N_2$) of arithmetic random number converter 5 in FIG. 9 in random number generating device 1 of the first embodiment. Specifically, reset voltage generating circuit 53 and selector switch 54 were eliminated in the configuration of arithmetic random number converter 5 in FIG. 7, and only the voltage from voltage generating circuit 52 was applied to ferroelectric gate transistor 71 of hysteresis unit 7. At this point, the voltage $V_W$ output from voltage generating circuit 52 was set to a range of −0.5 V≤$V_W$≤1.0 V. Other configurations were similar to those of random number generating device 1 of the first embodiment.

Figure 23:
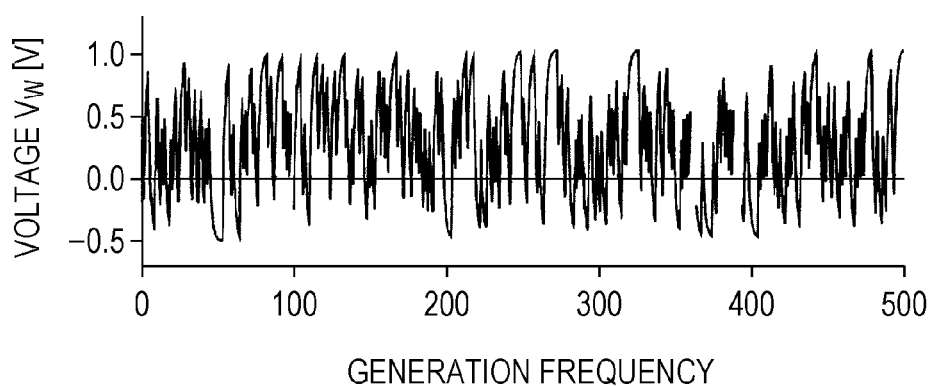
FIG. 23 is a graph illustrating the voltage $V_W$ sequentially output from a voltage generating circuit of a random number generating device according to a comparative example.
Figure 24:
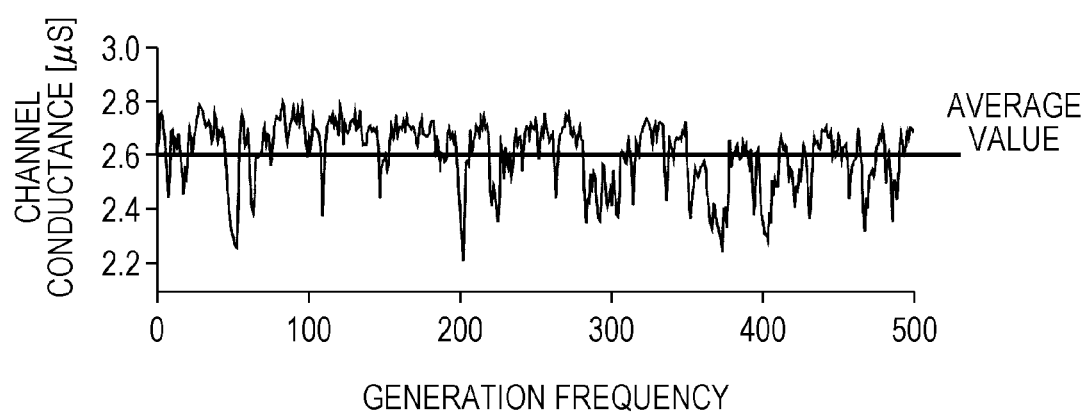
FIG. 24 is a graph illustrating the channel conductance sequentially output based on the voltage $V_W$ in FIG. 23.

FIG. 23 is a graph illustrating the voltage $V_W$ sequentially output from the voltage generating circuit of the random number generating device of the comparative example, and FIG. 24 is a graph illustrating the channel conductance sequentially output based on the voltage $V_W$ in FIG. 23. It is found that a change frequency of the channel conductance in FIG. 24 becomes sparse compared with the change in channel conductance of the first embodiment in FIG. 15. A ferroelectric material has a characteristic that the conductance is hardly changed when the small voltages having the identical polarity are applied. Therefore, the change frequency of the channel conductance is considered to be sparse. This phenomenon is not limited to the ferroelectric material, but the phenomenon is similarly exerted in an element having the hysteresis characteristic although there is a small difference. It is said that the large output change is unlikely to occur unless the polarity changes due to an influence of the characteristic. In the comparative example, although the voltage $V_W$ output from voltage generating circuit 52 takes both the positive and negative values, the change in channel conductance does not increase. Therefore, it is necessary that the voltages having the inverted polarities be alternately input to the hysteresis unit.

Figure 25:
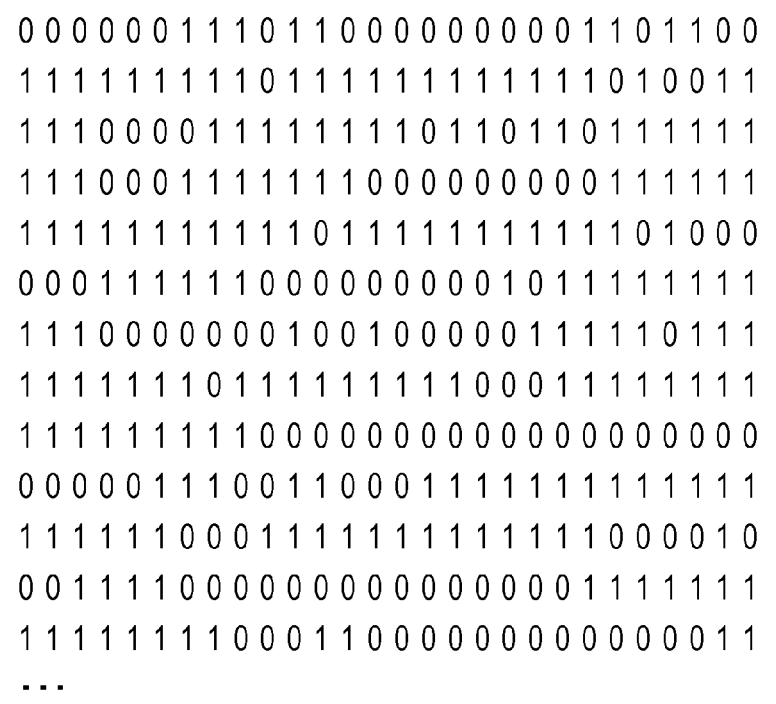

FIG. 25 is a view illustrating the arithmetic random number sequence generated by the random number generating device of the comparative example. Compared with the arithmetic random number sequence of the first embodiment in FIG. 16, 0 or 1 is frequently continued and the number of outcomes of 0 or 1 is increased at a glance in the arithmetic random number sequence of FIG. 25. As described above, this is mainly because the large change in conductance is not generated unless the polarity of the applied voltage changes. The continuous numerical values degrade the characteristic of the arithmetic random number.

Table 2 illustrates the verification result of the arithmetic random number sequence in FIG. 25 based on FIPS 140.

TABLE 2

| Test | | Acceptable range | Measurement result | Acceptable level |
|---|---|---|---|---|
| Mono-bit test | | 9725 to 10043 | 11842 | x |
| Run test | 1 has 1 outcome | 2315 to 2685 | 568 | x |
| | 1 has 2 outcomes | 1114 to 1386 | 384 | x |
| | 1 has 3 outcomes | 527 to 723 | 224 | x |
| | 1 has 4 outcomes | 240 to 384 | 188 | x |
| | 1 has 5 outcomes | 103 to 209 | 140 | o |
| | 1 has 6 outcomes or more | 103 to 209 | 758 | x |
| | 0 has 1 outcome | 2315 to 2685 | 887 | x |
| | 0 has 2 outcomes | 1114 to 1386 | 335 | x |
| | 0 has 3 outcomes | 527 to 723 | 254 | x |
| | 0 has 4 outcomes | 240 to 384 | 182 | x |
| | 0 has 5 outcomes | 103 to 209 | 129 | o |
| | 0 has 6 outcomes or more | 103 to 209 | 475 | x |
| Long run test | The number of longest outcomes of 1 | <26 | 44 | x |
| | The number of longest outcomes of 0 | <26 | 31 | x |

As is clear from Table 2, almost all items are not acceptable.

As is clear from the above, even if the input signal is controlled so as to be operated in the minor loop of the hysteresis unit, the high-quality arithmetic random number is hardly generated unless the numerical sequences $N_1$ and $N_2$ having the reversal polarities are alternately input.

Although the embodiments of the present disclosure are described above, the present disclosure is not limited to the embodiments, but various changes, modifications, and improvements can be made without departing from the scope of the present disclosure.

The random number generating device of the present disclosure can obtain the arithmetic random number in which the periodic characteristic is eliminated with the simple structure. When the arithmetic random number is used as a cipher key of a file, a possibility of decrypting data is extremely lowered. When the arithmetic random number obtained in the present disclosure is used as the arithmetic random number for a simulation, a higher-reliability analysis result can be obtained because the arithmetic random number has no periodic characteristic.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

The invention claimed is:

1. A random number generating device comprising:
an arithmetic random number generator that generates an arithmetic random number sequence;
an arithmetic random number converter that sequentially reads at least one arithmetic random number from the arithmetic random number sequence and converts a value of the read arithmetic random number into a voltage or current value of at least two predetermined levels of gray scale having an identical polarity;

a hysteresis unit that outputs values depending on a presently-input voltage or current value and a previously-input voltage or current value with respect to the sequentially-input voltage or current value; and a threshold processor that binarizes the output of the hysteresis unit, wherein the arithmetic random number converter alternately outputs a positive value and a negative value using the voltage or current that is converted based on the arithmetic random number, and outputs the voltage or current value of the at least two levels of gray scale converted according to the value of the arithmetic random number as at least one of the positive value and the negative value.

2. The random number generating device according to claim 1, wherein the arithmetic random number converter includes:

an N-ary number converting circuit that sequentially reads an arithmetic random number having a predetermined number of bits from the arithmetic random number sequence and converts the arithmetic random number of each number of bits into an N-ary number (N≥2); and a gray-scale generating circuit that converts the value of the arithmetic random number into the voltage or current by allocating the value of the arithmetic random number to one of voltage levels and current levels of at least two predetermined levels of gray scale based on the value of the arithmetic random number converted into the N-ary number.

3. The random number generating device according to claim 1, wherein in a saturated loop characteristic curve of the hysteresis unit, assuming that $Y_{max}$ is a maximum output value for an input value of 0, that $Y_{min}$ is a minimum output value for the input value of 0, that $\Delta Y$ is $Y_{max}-Y_{min}$, and that $X_{W1}$, $X_{W2}$, $X_{W3}$, and $X_{W4}$ are input values in which the output value becomes $Y_L=Y_{min}+\Delta Y/10$ or $Y_H=Y_{max}-\Delta Y/10$ in ascending order, the arithmetic random number converter outputs the value such that a value $N_1$ that is one of the alternately-output positive and negative values falls within a range of $X_{W1} \leq N_1 \leq X_{W2}$ while a value $N_2$ that is the other of the positive and negative values falls within a range of $X_{W3} \leq N_2 \leq X_{W4}$, or such that the value $N_2$ falls within a range of $X_{W1} \leq N_2 \leq X_{W2}$ while the value $N_1$ falls within a range of $X_{W3} \leq N_1 \leq X_{W4}$.

4. The random number generating device according to claim 1, wherein the arithmetic random number converter outputs the voltage or current value of at least two levels of gray scale converted according to the value of the arithmetic random number as the value $N_1$ that is one of the alternately-output positive and negative values, and outputs a predetermined fixed value as the value $N_2$ that is the other of the positive and negative values.

5. The random number generating device according to claim 1, wherein the arithmetic random number converter outputs voltage, and the hysteresis unit includes a ferroelectric gate transistor in which the voltage output from the arithmetic random number converter is input to a gate, and conductance between a source and a drain changes according to a change in voltage input to the gate.

6. The random number generating device according to claim 1, wherein the arithmetic random number converter outputs current, and the hysteresis unit includes a magnetic body such that a magnetization state of the magnetic body changes by causing the magnetic body to generate a magnetic field based on the current output from the arithmetic random number converter.

7. The random number generating device according to claim 1, wherein the arithmetic random number converter outputs voltage, and the hysteresis unit includes a resistance change element in which a resistance value changes by applying the voltage output from the arithmetic random number converter.

8. The random number generating device according to claim 1, wherein the arithmetic random number generator includes a linear feedback shift register.

9. The random number generating device according to claim 1, wherein the threshold processor uses an average value of the previously-input values as a binarizing threshold with respect to the value output from the hysteresis unit.

* * * * *